(12) United States Patent
Nishikiori

(10) Patent No.: US 11,228,005 B2
(45) Date of Patent: Jan. 18, 2022

(54) ORGANIC EL DISPLAY PANEL HAVING DUMMY LIGHT EMITTING LAYERS AND METHOD FOR MANUFACTURING ORGANIC EL DISPLAY PANEL HAVING DUMMY LIGHT EMITTING LAYERS

(71) Applicant: JOLED INC., Tokyo (JP)

(72) Inventor: Toshiki Nishikiori, Tokyo (JP)

(73) Assignee: JOLED INC., Tokyo (JP)

( * ) Notice: Subject to any disclaimer, the term of this patent is extended or adjusted under 35 U.S.C. 154(b) by 104 days.

(21) Appl. No.: 16/726,930

(22) Filed: Dec. 26, 2019

(65) Prior Publication Data

US 2020/0227661 A1    Jul. 16, 2020

(30) Foreign Application Priority Data

Jan. 11, 2019  (JP) .............................. JP2019-003386
Jun. 28, 2019  (JP) .............................. JP2019-121412

(51) Int. Cl.

| H01L 51/00 | (2006.01) |
| H01L 27/32 | (2006.01) |
| H01L 51/56 | (2006.01) |
| H01L 51/50 | (2006.01) |

(52) U.S. Cl.
CPC ...... *H01L 51/0096* (2013.01); *H01L 27/3211* (2013.01); *H01L 27/3223* (2013.01); *H01L 27/3246* (2013.01); *H01L 51/001* (2013.01); *H01L 51/0004* (2013.01); *H01L 51/0021* (2013.01); *H01L 51/56* (2013.01); *H01L 51/5012* (2013.01); *H01L 51/5056* (2013.01); *H01L 51/5072* (2013.01); *H01L 51/5088* (2013.01); *H01L 2227/323* (2013.01)

(58) Field of Classification Search
None
See application file for complete search history.

(56) References Cited

U.S. PATENT DOCUMENTS

| 5,443,922 A | 8/1995 | Nishizaki et al. |
| 2005/0264186 A1 | 12/2005 | Seki et al. |
| 2005/0266169 A1 | 12/2005 | Seki et al. |

(Continued)

FOREIGN PATENT DOCUMENTS

| JP | H5-163488 A | 6/1993 |
| JP | 2004-87508 A | 3/2004 |

(Continued)

*Primary Examiner* — Nduka E Ojeh
(74) *Attorney, Agent, or Firm* — Hauptman Ham, LLP

(57) ABSTRACT

A light-transmissive organic EL display panel including: a light transmissive substrate; organic EL elements on the substrate, where pixels each including a plurality of organic EL elements arranged along a row direction are arranged in pixel columns arranged in parallel along the row direction, and intervals between the pixel columns are each greater than a width in the row direction of any of the pixel columns; and dummy light emitting layers, wherein each of the organic EL elements included in one of the pixels includes any one of a plurality of organic light emitting materials that emit different colors of light, and the dummy light emitting layers include any one of the plurality of organic light emitting materials and are present above portions of non-pixel regions adjacent to the pixel columns in the row direction.

14 Claims, 28 Drawing Sheets

(56) References Cited

U.S. PATENT DOCUMENTS

| | | | |
|---|---|---|---|
| 2008/0315760 A1 | 12/2008 | Seki et al. | |
| 2011/0147770 A1* | 6/2011 | Hwang | H01L 27/326 257/89 |
| 2015/0279918 A1* | 10/2015 | Teraguchi | H01L 27/3276 257/40 |
| 2018/0301658 A1* | 10/2018 | Chung | H01L 51/56 |
| 2021/0118959 A1* | 4/2021 | Sano | H01L 51/5265 |

FOREIGN PATENT DOCUMENTS

| | | |
|---|---|---|
| JP | 2005-259718 A | 9/2005 |
| JP | 2009-64793 A | 3/2009 |

* cited by examiner

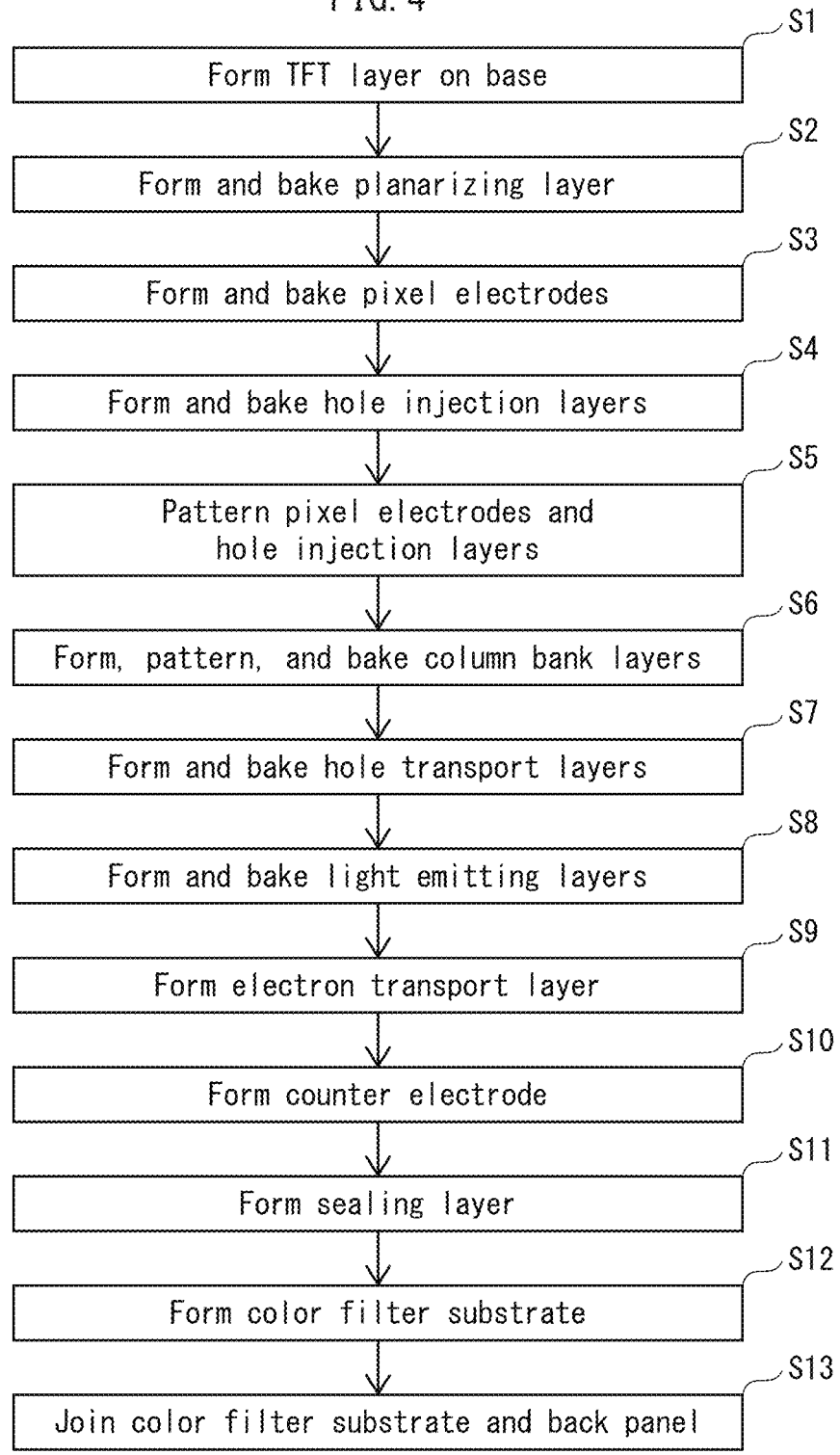

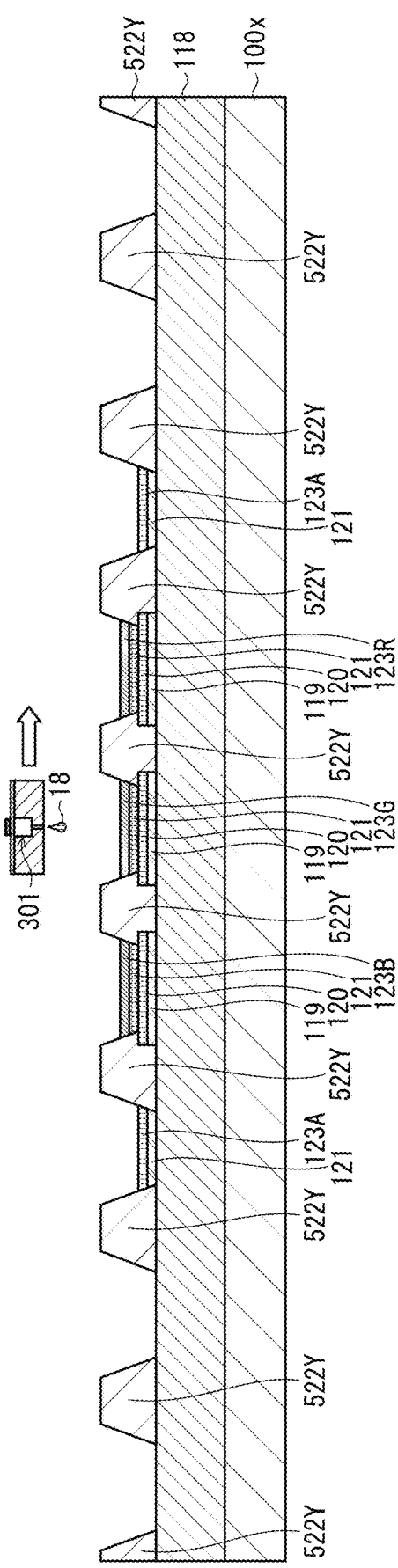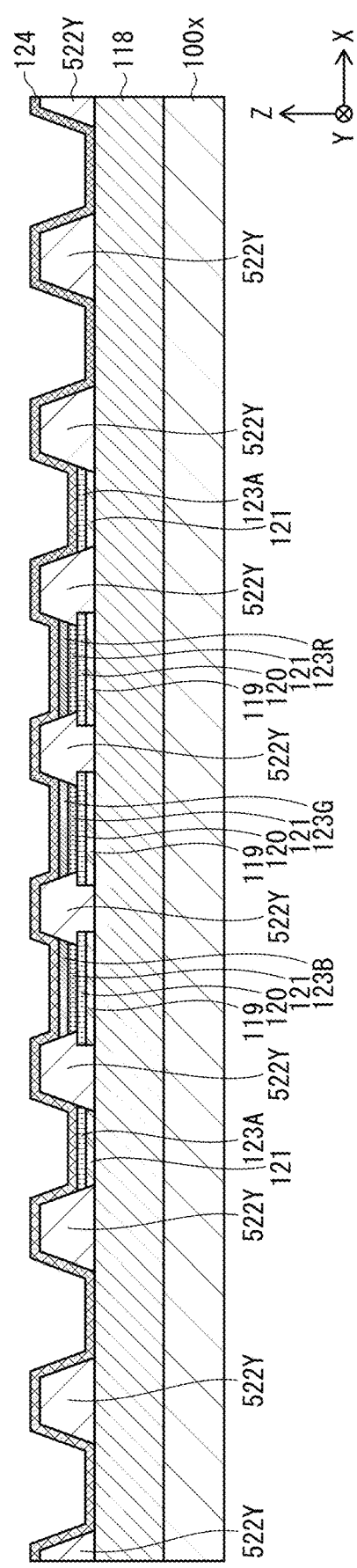

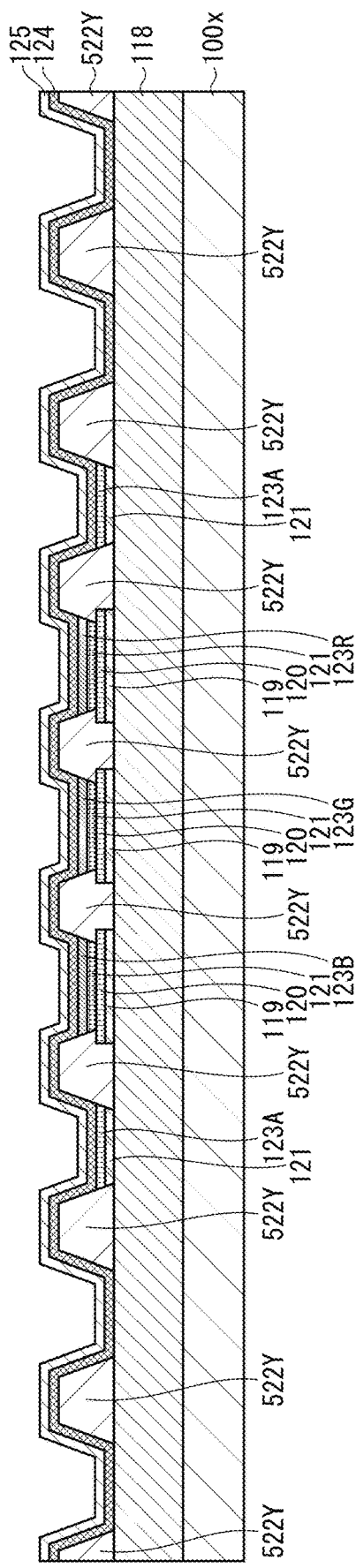
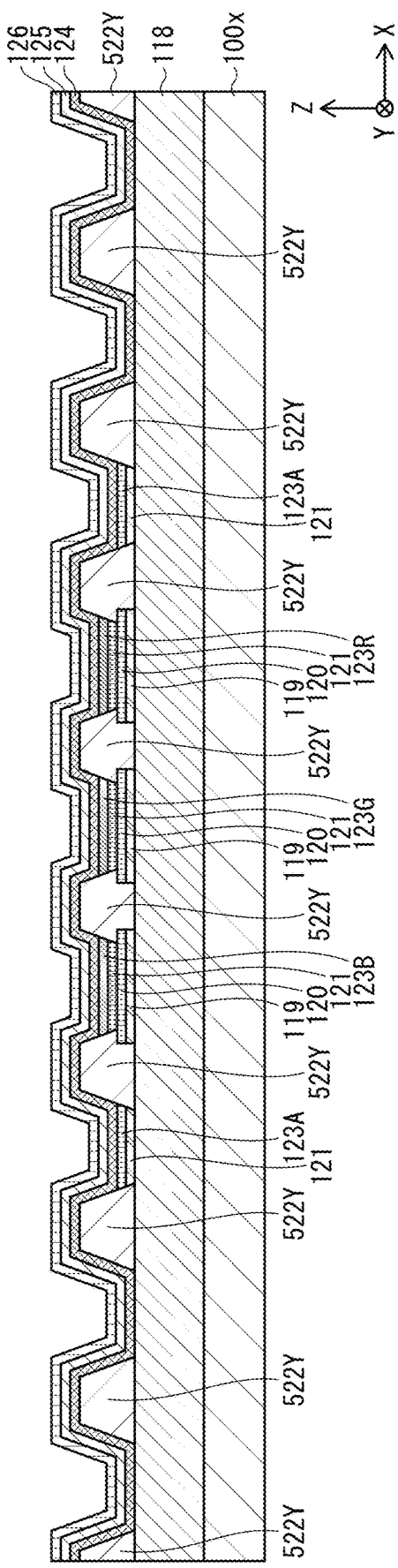

FIG. 10A
FIG. 10B
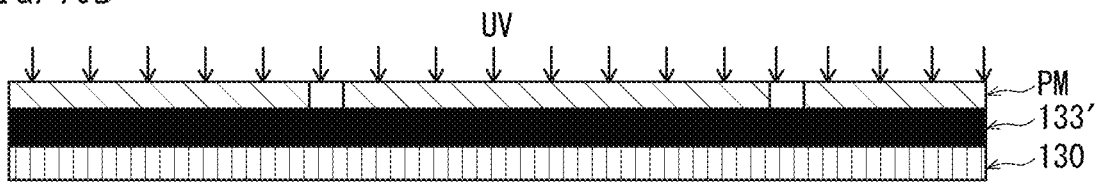
FIG. 10C
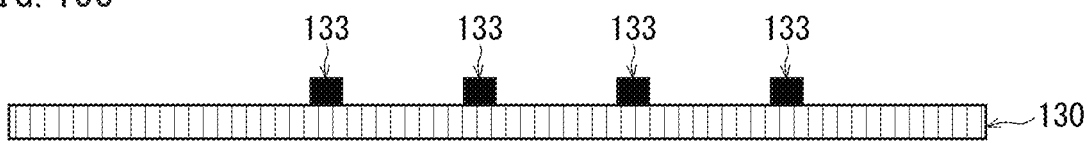
FIG. 10D
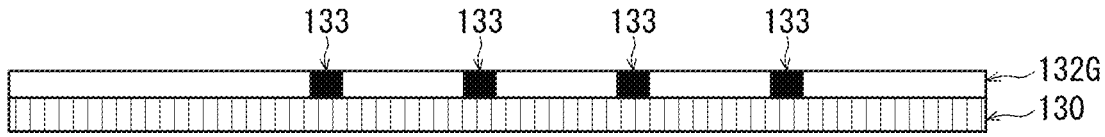
FIG. 10E
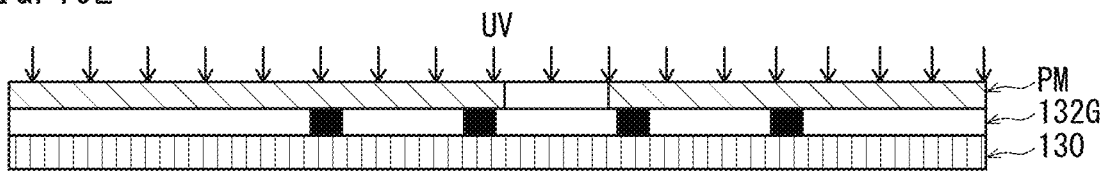
FIG. 10F
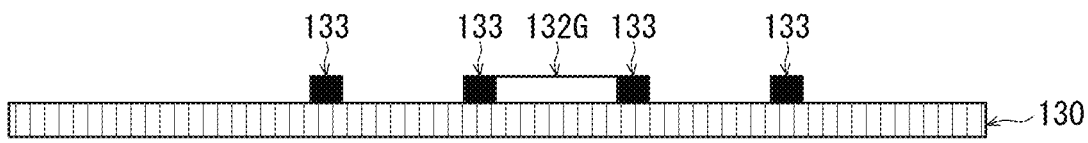
FIG. 10G
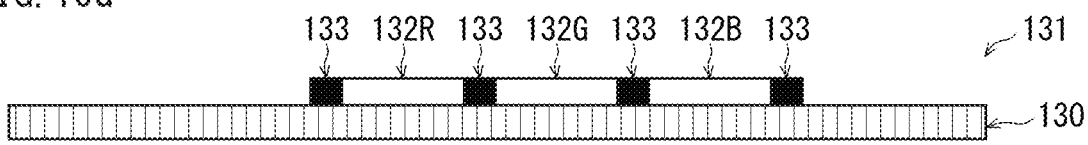
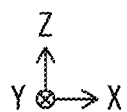

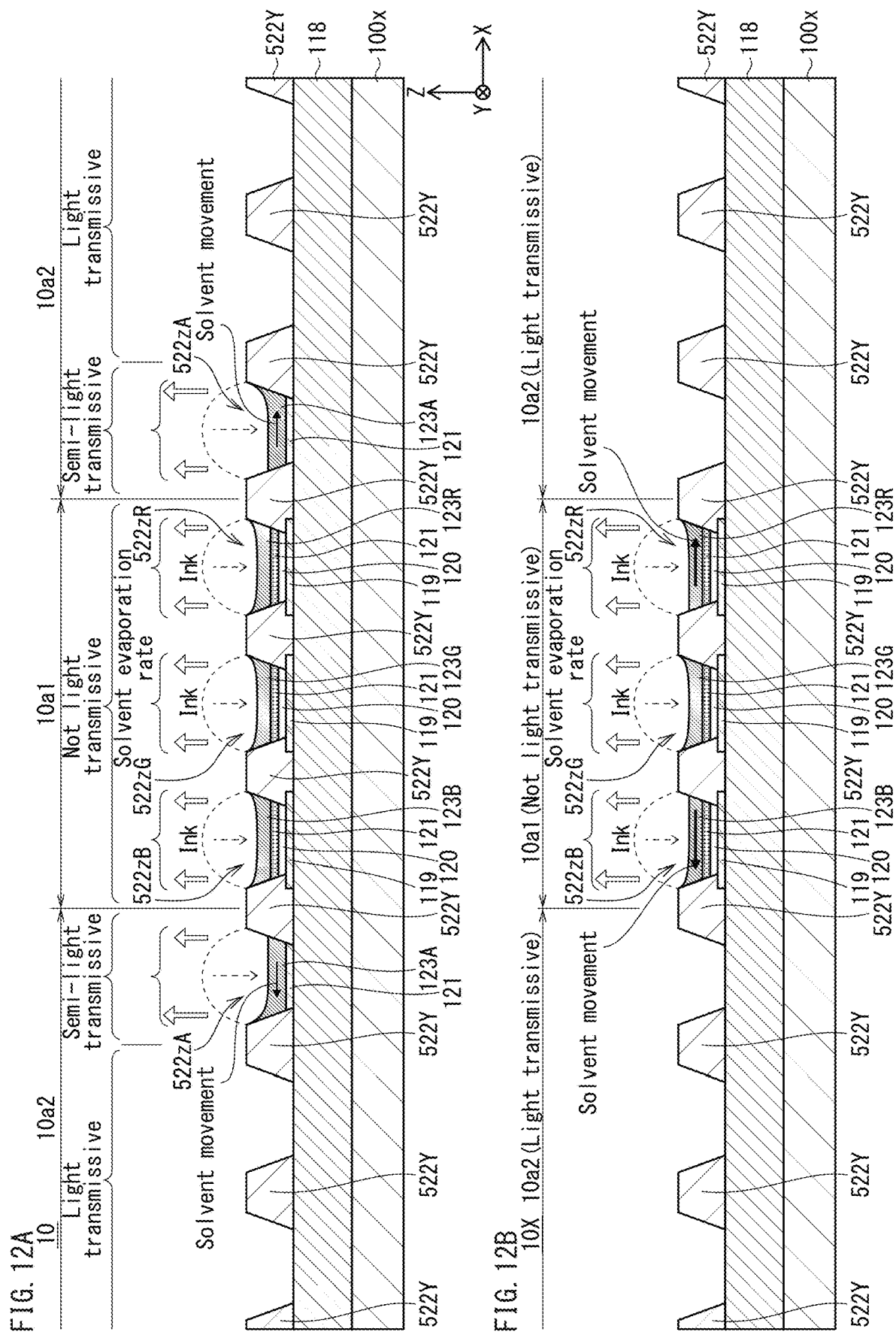

FIG. 16

(Nanometer unit)

|  | Dummy gap application | Mean | Distribution |
|---|---|---|---|
| Embodiment 1 | Red ink | 1.40 | 2.02 |
|  | Green ink | 1.17 | 1.82 |
|  | Blue ink | 1.14 | 1.83 |
| Embodiment 2 | Blue ink | 3.26 | 3.14 |
| Embodiment 3 | No ink | 20.61 | 8.44 |

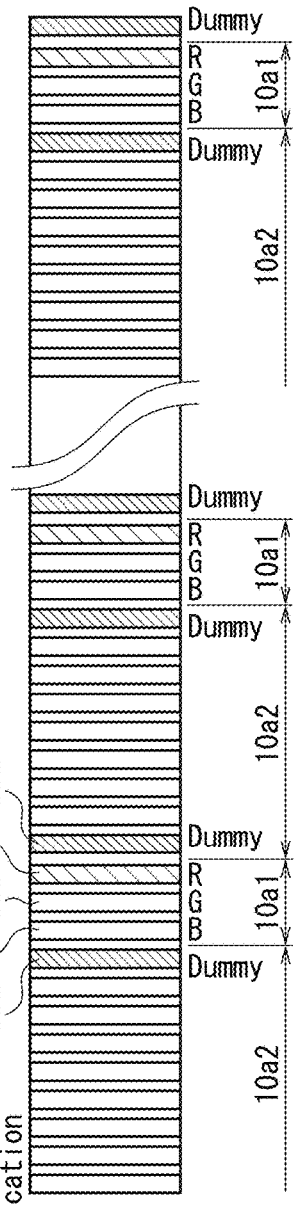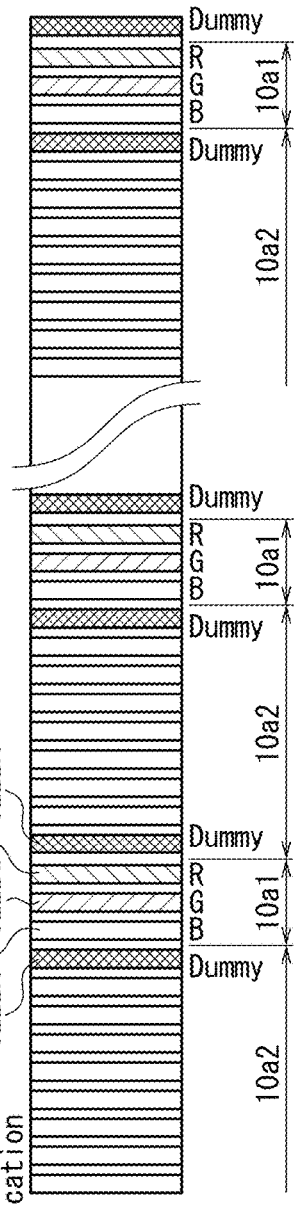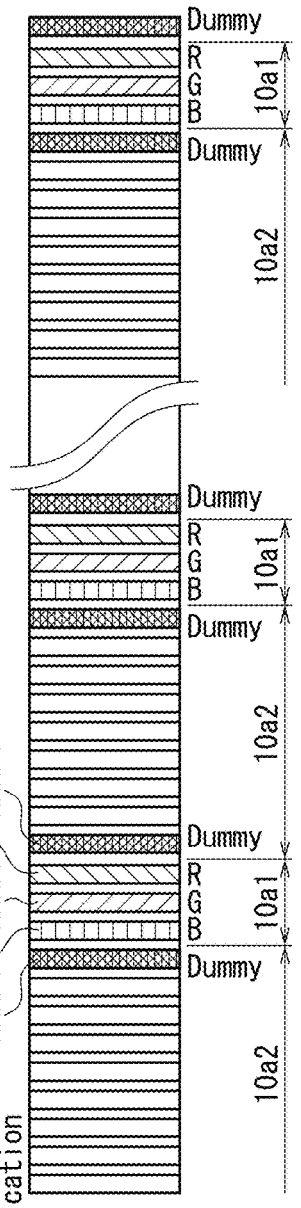
FIG. 17A  Red ink application
FIG. 17B  Green ink application
FIG. 17C  Blue ink application

ORGANIC EL DISPLAY PANEL HAVING DUMMY LIGHT EMITTING LAYERS AND METHOD FOR MANUFACTURING ORGANIC EL DISPLAY PANEL HAVING DUMMY LIGHT EMITTING LAYERS

This application claims priority to Japanese Patent Application No. 2019-3386 filed Jan. 11, 2019, and Japanese Patent Application No. 2019-121412 filed Jun. 28, 2019, the contents of which are hereby incorporated by reference in their entirety.

BACKGROUND OF THE DISCLOSURE

Technical Field

The present disclosure relates to organic electroluminescence (EL) display panels that make use of electroluminescence of an organic material, and in particular to techniques for improving image quality of light transmissive organic EL display panels that emit, from a front surface, light incident on a back surface of a light-transmissive substrate thereof and light emitted from organic EL elements.

Description of the Related Art

In recent years, organic EL display panels in which organic EL elements are arranged in a matrix on a substrate have been implemented as display panels used in display devices such as digital televisions.

An organic EL element has a structure in which a light emitting layer containing an organic light emitting material is disposed between a pair of electrodes. The light emitting layers of adjacent organic EL elements are separated by a bank made of an insulating material. An organic EL element emits light when driven, when a voltage is applied between the pair of electrodes, causing recombination of holes and electrons injected into the light emitting layer.

When manufacturing an organic EL display panel as described above, in particular in production of light emitting layers and the like, an ink solute of the organic light emitting material may be discharged and applied onto a substrate, then dried, by using a droplet discharge method (inkjet method).

At such time, partial pressure of solvent molecules evaporated from applied ink liquid is low in a peripheral portion of an application region on the substrate, and therefore the applied ink starts to dry faster in the peripheral portion than in a central portion of the application region on the substrate. In this way, a difference in drying time of the ink liquid applied on the substrate may cause uneven film thickness of the light emitting layer in the application region on the substrate, which may cause uneven brightness. As a technique for making film thickness of an organic EL thin film uniform in the application region, a technique for applying a compound containing an organic light emitting material around the application region or between adjacent display pixels has been proposed (for example, in JP 2005-259718 and JP 2004-87508).

SUMMARY

An organic EL display panel pertaining to one aspect of the present disclosure is a light transmissive organic EL display panel including: a light transmissive substrate; organic EL elements on the substrate, where pixels each including a plurality of the organic EL elements arranged along a row direction are arranged in pixel columns each including a plurality of the pixels arranged along a column direction, the pixel columns are arranged in parallel along the row direction, and intervals between the pixel columns are each greater than a width in the row direction of any of the pixel columns; and dummy light emitting layers, wherein each of the organic EL elements included in one of the pixels includes any one of a plurality of organic light emitting materials that emit different colors of light, and when each portion of the substrate corresponding to one of the intervals is defined as a non-pixel region of the substrate, the dummy light emitting layers include any one of the plurality of organic light emitting materials and are present above portions of the non-pixel regions adjacent to the pixel columns in the row direction.

A method of manufacturing an organic EL display panel pertaining to an aspect of the present disclosure is a method of manufacturing a light transmissive organic EL display panel, the method including: preparing a substrate; above the substrate, arranging columns of sub-pixel electrodes in each of which a plurality of sub-pixel electrodes are arranged along a column direction into sub-pixel electrode column groups of parallel sub-pixel electrode columns separated from each other by first gaps in the row direction, and arranging the sub-pixel electrode column groups parallel to each other and separated from each other by second gaps in the row direction wider than the first gaps in the row direction; forming column banks that extend in the column direction, so as to sandwich each of the sub-pixel electrode columns in the row direction on portions of a top surface of the substrate where the sub-pixel electrode column groups are present, and at a pitch of the sub-pixel electrodes in the row direction on portions of the top surface of the substrate corresponding to the second gaps; applying ink including organic light emitting material to, among gaps between the column banks, pixel gaps where the sub-pixel electrodes are present and, among non-pixel gaps where the sub-pixel electrodes are not present, at least non-pixel gaps adjacent to the pixel gaps in the row direction; evaporating a solvent included in the ink to form light emitting layers in the pixel gaps and dummy light emitting layers in the non-pixel gaps adjacent to the pixel gaps in the row direction; and forming a counter electrode above the light emitting layers.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 4 is a flowchart of a process of manufacturing an organic EL display panel 10 according to at least one embodiment.

FIGS. 8A and 8B are schematic cross section diagrams taken from the same location as X1-X1 in FIG. 2 illustrating states in manufacturing of the organic EL display panel 10 according to at least one embodiment.

FIGS. 9A and 9B are schematic cross section diagrams taken from the same location as X1-X1 in FIG. 2 illustrating states in manufacturing of the organic EL display panel 10 according to at least one embodiment.

FIGS. 10A, 10B, 10C, 10D, 10E, 10F, and 10G are schematic cross section diagrams taken from the same location as X1-X1 in FIG. 2 illustrating states in manufacturing of the organic EL display panel 10 according to at least one embodiment.

FIG. 12A is a schematic cross section diagram illustrating a process of forming light emitting layers of the organic EL display panel 10 according to at least one embodiment, and FIG. 12B is a schematic cross section diagram illustrating a process of forming light emitting layers of a reference example.

FIG. 16 is a diagram illustrating averages and distributions of differences between heights a and b (b−a) of light emitting layers at measurement positions for embodiments 1 and 2 of the organic EL display panel 10 and a reference example.

FIGS. 17A, 17B, and 17C are schematic plan view diagrams of a same portion as portion A in FIG. 1, illustrating formation of light emitting layers of an organic EL display panel 10A pertaining to Modification 1.

DETAILED DESCRIPTION

Figure 1:
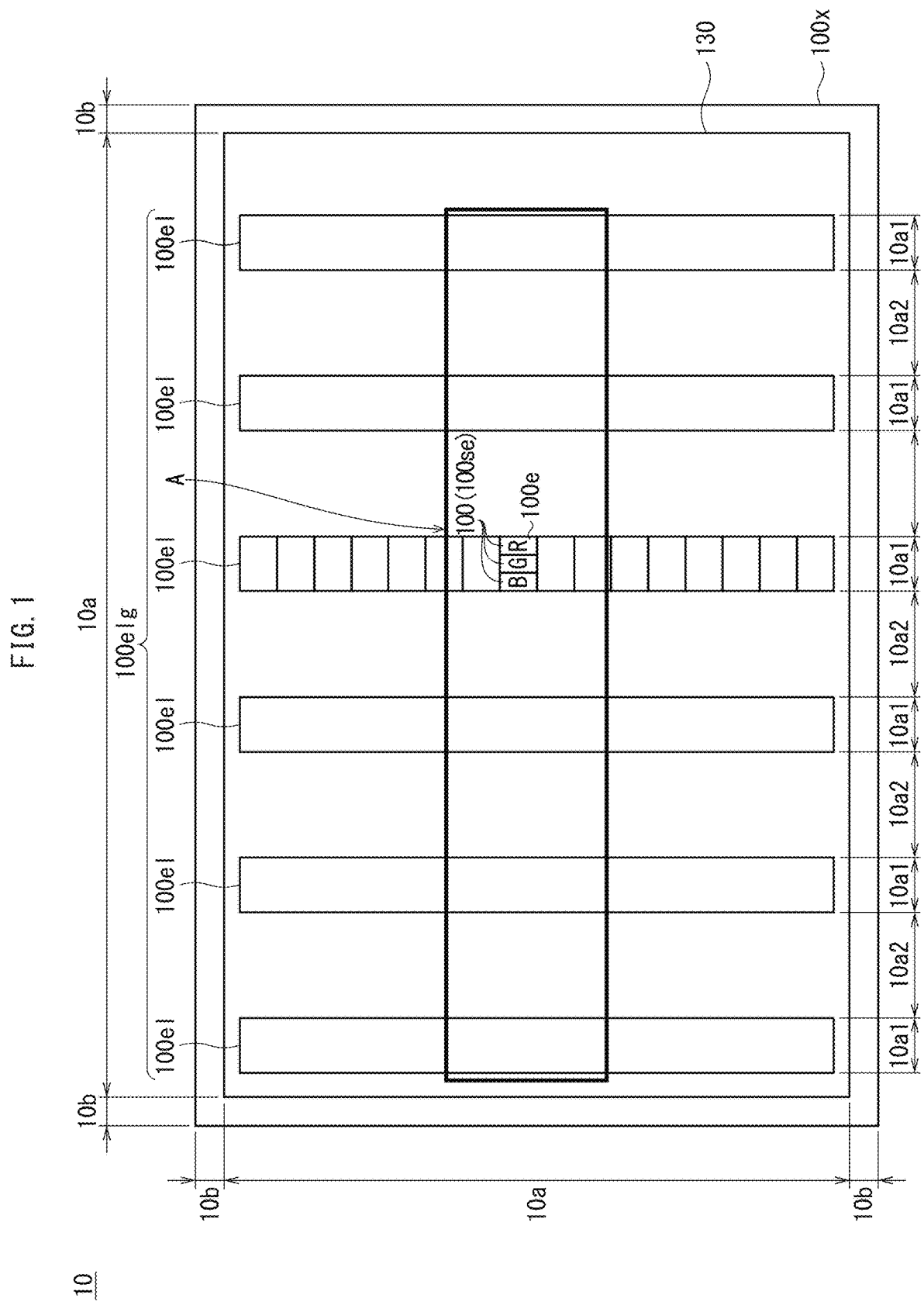
FIG. 1 is a plan view diagram of an organic EL display panel 10 according to at least one embodiment.

Background to Embodiments of the Present Disclosure

Assuming a light-transmissive organic EL display panel that emits, from a front surface, light incident on a back surface of a light-transmissive substrate and light emitted from organic EL elements, pixel density in the plane of the substrate is lowered or a region with low pixel density is generated in order to ensure a light-transmissive region. For this reason, there is a concern that when compared to a reflective organic EL display panel, significant light emitting layer film thickness unevenness occurs in the application region within a region of the substrate, causing uneven brightness.

The present disclosure provides description of an organic EL display panel and a method of manufacturing an organic EL display panel, according to which a light transmissive organic EL display panel suppresses occurrence of uneven brightness by suppressing occurrence of uneven thickness of light emitting layers in an application region within a region of the substrate.

Overview of Embodiments of Present Disclosure

An organic EL display panel pertaining to one aspect of the present disclosure is a light transmissive organic EL display panel including: a light transmissive substrate; organic EL elements on the substrate, where pixels each including a plurality of the organic EL elements arranged along a row direction are arranged in pixel columns each including a plurality of the pixels arranged along a column direction, the pixel columns are arranged in parallel along the row direction, and intervals between the pixel columns are each greater than a width in the row direction of any of the pixel columns; and dummy light emitting layers, wherein each of the organic EL elements included in one of the pixels includes any one of a plurality of organic light emitting materials that emit different colors of light, and when each portion of the substrate corresponding to one of the intervals is defined as a non-pixel region of the substrate, the dummy light emitting layers include any one of the plurality of organic light emitting materials and are present above portions of the non-pixel regions adjacent to the pixel columns in the row direction.

According to this structure, it is possible to suppress occurrence of uneven film thickness in light emitting layers in application regions of a substrate of a light transmissive organic EL display panel. Accordingly, large brightness differences can be suppressed if they depend on the direction and extent of sub-pixel imbalance when viewed from an oblique angle when a mix of sub-pixels have thicknesses that are unbalanced to different extents and in different directions. Thus, visibility from an oblique angle can be improved, and the invention can be effectively used as a light transmissive display panel that requires higher visibility when viewed from an oblique angle than a reflective display panel because viewing angle of a display image varies due to the influence of a positional relationship between the viewer and a background object.

Further, according to at least one embodiment, in the non-pixel regions, the portions where the dummy light emitting layers are present have a lower visible light transmittance in a thickness direction of the substrate than portions where the dummy light emitting layers are not present.

According to this structure, it is possible to suppress the occurrence of uneven film thickness of light emitting layers in application regions of a substrate, and to improve visible light transmittance in portions where the dummy light emitting layers are not present in non-pixel gaps, and to improve visibility of a transmitted image in a light transmissive display panel.

Further, according to at least one embodiment, the dummy light emitting layers include each of the plurality of the organic light emitting materials included in any one of the pixels.

According to this structure, in every scan applying blue (B), green (G), or red (R) ink, ink can be applied to all of the dummy gaps to fill to an overflow limit, and to a subset of the pixel gaps. As a result, an increase in ink film thickness in portions of pixel regions near boundaries with non-pixel regions can be further suppressed.

Further, according to at least one embodiment, among the dummy light emitting layers adjacent to the pixel columns, peripheral dummy light emitting layers near edges of the substrate in the row direction contain more organic light emitting material than central dummy light emitting layers near a center of the substrate in the row direction.

According to this structure, it is possible to suppress a phenomenon in which ink film thickness increases significantly in portions of pixel regions near boundaries with non-pixel regions in peripheral portions of the substrate.

Further, according to at least one embodiment, the peripheral dummy light emitting layers are wider in the row direction than the central dummy light emitting layers.

According to this structure, peripheral dummy light emitting layers near edges of the substrate in the row direction contain more organic light emitting material than central dummy light emitting layers near a center of the substrate in the row direction.

Further, according to at least one embodiment, the peripheral dummy light emitting layers have a greater film thickness than the central dummy light emitting layers.

Further, according to at least one embodiment, the substrate includes a base and a planarizing layer made of an organic material formed on a top surface of the base, and the dummy light emitting layers are present in grooves that are recesses in the planarizing layer.

According to this structure, it is possible to increase amounts of ink filling the dummy gaps $522zA$ more in the peripheral portion of the substrate than the central portion, without changing widths of the dummy light emitting layers in plan view.

Further, according to at least one embodiment, the organic EL display panel further includes column banks that extend in the column direction on the top surface of the substrate, wherein the column banks define pixel gaps between the column banks in the pixel columns, the organic EL elements in the pixel gaps each include a sub-pixel electrode and a portion of a light emitting layer, the organic light emitting materials of the organic EL elements are in the light emitting layers, and in the non-pixel regions, among non-pixel gaps between the column banks, the dummy light emitting layers are present in dummy pixel gaps nearest the pixel columns in the row direction.

Further, according to at least one embodiment, among the column banks, column banks sandwiching the dummy pixel gaps are higher than column banks sandwiched by the pixel gaps.

According to this structure, peripheral dummy light emitting layers near edges of the substrate in the row direction contain more organic light emitting material than central dummy light emitting layers near a center of the substrate in the row direction.

A method of manufacturing an organic EL display panel pertaining to an aspect of the present disclosure is a method of manufacturing a light transmissive organic EL display panel, the method including: preparing a substrate; above the substrate, arranging columns of sub-pixel electrodes in each of which a plurality of sub-pixel electrodes are arranged along a column direction into sub-pixel electrode column groups of parallel sub-pixel electrode columns separated from each other by first gaps in the row direction, and arranging the sub-pixel electrode column groups parallel to each other and separated from each other by second gaps in the row direction wider than the first gaps in the row direction; forming column banks that extend in the column direction, so as to sandwich each of the sub-pixel electrode columns in the row direction on portions of a top surface of the substrate where the sub-pixel electrode column groups are present, and at a pitch of the sub-pixel electrodes in the row direction on portions of the top surface of the substrate corresponding to the second gaps; applying ink including organic light emitting material to, among gaps between the column banks, pixel gaps where the sub-pixel electrodes are present and, among non-pixel gaps where the sub-pixel electrodes are not present, at least non-pixel gaps adjacent to the pixel gaps in the row direction; evaporating a solvent included in the ink to form light emitting layers in the pixel gaps and dummy light emitting layers in the non-pixel gaps adjacent to the pixel gaps in the row direction; and forming a counter electrode above the light emitting layers.

According to this method, a decrease in solvent vapor pressure in peripheral portions relative to central portions of pixel gaps near boundaries with non-pixel gaps can be suppressed by the presence of ink in dummy light emitting layers applied to dummy gaps. Thus, in the gaps, differences in evaporation rates of solvent between the outward ink portions and the inward ink portions in the pixel regions are reduced.

As a result, an increase in ink film thickness in portions of pixel regions near boundaries with non-pixel regions can be suppressed. That is, it is possible to suppress occurrence of uneven film thickness in light emitting layers in application regions of a substrate.

Further, according to at least one embodiment, in pixel gaps corresponding to the sub-pixel electrodes included in any one of the sub-pixel electrode column groups, ink including organic light emitting material of a different color is applied to each of the pixel gaps, and one or more inks selected from the inks including organic light emitting materials of different colors are applied in the non-pixel gaps adjacent to the pixel gaps in the row direction.

That is, it is possible to suppress occurrence of uneven film thickness in light emitting layers in application regions of a substrate for a structure in which each organic EL element included in one pixel includes any one of a plurality of organic light emitting materials each emitting a different color of light.

Further, according to at least one embodiment, in the applying of ink to the pixel gaps, inks are applied in an order such that inks having a longer solvent evaporation time per unit area are applied earlier.

According to this method, applied ink with a short solvent evaporation time can be placed in an environment with a high solvent vapor pressure to suppress drying. As a result, it is possible to suppress the phenomenon of increases in ink film thicknesses of outward ink portions in the pixel regions for ink having a short solvent evaporation time.

Further, according to at least one embodiment, the organic EL display panel further includes column banks that extend in the column direction on the top surface of the substrate, wherein the column banks define pixel gaps between the column banks in the pixel columns, the organic EL elements in the pixel gaps each include a sub-pixel electrode and a portion of a light emitting layer, the organic light emitting materials of the organic EL elements are in the light emitting layers, and among the column banks, first column banks are disposed outermost in the pixel columns in the row direction, second column banks are the only column banks in the non-pixel regions, the first column banks and the second column banks sandwich dummy gaps, and the dummy light emitting layers are present in the dummy gaps.

According to this structure, the display panel has improved visibility of an object on the back side of the display panel (background object).

Further, according to at least one embodiment, two of the dummy light emitting layers adjacent to one of the pixel columns are connected to each other in the row direction by end portions of the two of the dummy light emitting layers in the column direction.

According to this structure, it is possible to suppress a phenomenon of inks of the light emitting layers applied to the pixel gaps in the pixel regions having a relatively high solvent evaporation rate in peripheral portions in the column direction of the pixel regions and therefore starting to dry from the peripheral portions in the column direction. As a result, it is possible to suppress occurrence of light emitting layer film thickness imbalance in the column direction in sub-pixels in peripheral portions in the column direction of the pixel regions, and a decrease in brightness of sub-pixels due to a failure to achieve an average film thickness required for sub-pixels. In particular, it is possible to suppress a large variation in luminance in peripheral portions in the column direction of the pixel regions when the display panel is viewed from an oblique direction.

Further, a method of manufacturing an organic EL display panel pertaining to an aspect of the present disclosure is a method of manufacturing a light transmissive organic EL display panel including: preparing a substrate; above the substrate, arranging columns of sub-pixel electrodes in each of which a plurality of sub-pixel electrodes are arranged along a column direction into sub-pixel electrode column groups of parallel sub-pixel electrode columns separated from each other by first gaps in the row direction, and arranging the sub-pixel electrode column groups parallel to each other and separated from each other by second gaps in the row direction wider than the first gaps in the row direction; forming column banks that extend in the column direction, so as to sandwich each of the sub-pixel electrode columns in the row direction on portions of a top surface of the substrate where the sub-pixel electrode column groups are present, and at a pitch of the sub-pixel electrodes in the row direction on portions of the top surface of the substrate corresponding to the second gaps; applying ink including organic light emitting material to, among gaps between the column banks, pixel gaps where the sub-pixel electrodes are present and applying dummy solvent to, among non-pixel gaps where the sub-pixel electrodes are not present, at least non-pixel gaps adjacent to the pixel gaps in the row direction; evaporating a solvent included in the ink and the dummy solvent to form light emitting layers in the pixel gaps; and forming a counter electrode above the light emitting layers.

According to this method, organic light emitting material does not remain after drying of the dummy solvent applied to the non-pixel gaps, and therefore in the completed display panel, visible light transmission can be improved in the non-pixel gaps adjacent to the pixel gaps, and visibility of a transmitted image can be improved for a light transmissive display panel.

EMBODIMENT

A organic EL display panel 10 (also referred to as "display panel 10") pertaining to the present embodiment is described with reference to the drawings. Note that the drawings are schematic diagrams and are not necessarily to scale.

Overall Structure of Display Panel 10

FIG. 1 is a plan view diagram of the display panel 10 according to at least one embodiment. Here, in the present description, the X direction, Y direction, and Z direction in the drawings represent a row direction, column direction, and thickness direction of the display panel 10, respectively. The display panel 10 is an organic electroluminescence (EL) panel that makes use of electroluminescence of organic materials, and has a basic structure in which a light transmissive substrate 100x and a light transmissive upper substrate 130 are arranged facing each other. The display panel 10 is a light transmissive organic EL display panel that emits from a front surface both light incident on a back surface of the substrate 100x and light emitted from organic EL elements.

As illustrated, in plan view, the display panel 10 includes an image display region 10a and a peripheral region 10b located outside a substrate of the image display region 10a. In the image display region 10a, a structure is adopted in which organic EL elements are arranged on a front surface of the substrate 100x, for example in a matrix at defined intervals in the X direction and/or the Y direction. According to the present embodiment, and as illustrated in FIG. 1, the display panel 10 includes pixel columns 100el in each of which a plurality of unit pixels 100e are arranged in the column direction, the pixel columns 100el being included in a pixel column group 100*elg* on the substrate 100*x* in the image display region 10*a*. The pixel columns 100*el* are arranged in parallel in the row direction with intervals between them that are wider in the row direction than the pixel columns 100*el* themselves. Each of the unit pixels 100*e* includes a plurality of sub-pixels 100*se* arranged in the row direction that each emit a different color, where one sub-pixel 100*se* is made of one organic EL element 100. In the present example, the plurality of organic EL elements 100 included in one of the pixels 100*e* are a blue (B) light emitting organic EL element 100, a green (G) light emitting organic EL element 100, and a red (R) light emitting organic EL element 100.

Structure of Image Display Region 10*a* of Display Panel 10

For the image display region 10*a* on the substrate 100*x*, a structure is adopted in which pixel regions 10*a*1 where the pixel columns 100*el* are present and non-pixel regions 10*a*2 where the pixel columns 100*el* are not present alternate across the image display region 10*a*. Width in the row direction of the non-pixel regions 10*a*2 may be, for example, 1 to 5 times width in the row direction of the pixel regions 10*a*1. According to this structure, when the pixel column group 100*elg* causes the pixels 100*e* in the pixel regions 10*a*1 to be lit, the display panel 10 functions as a display, and a viewer can view a display image displayed by the pixel column group 100*elg* and transmitted light from a back surface of the non-pixel regions 10*a*2.

Figure 2:
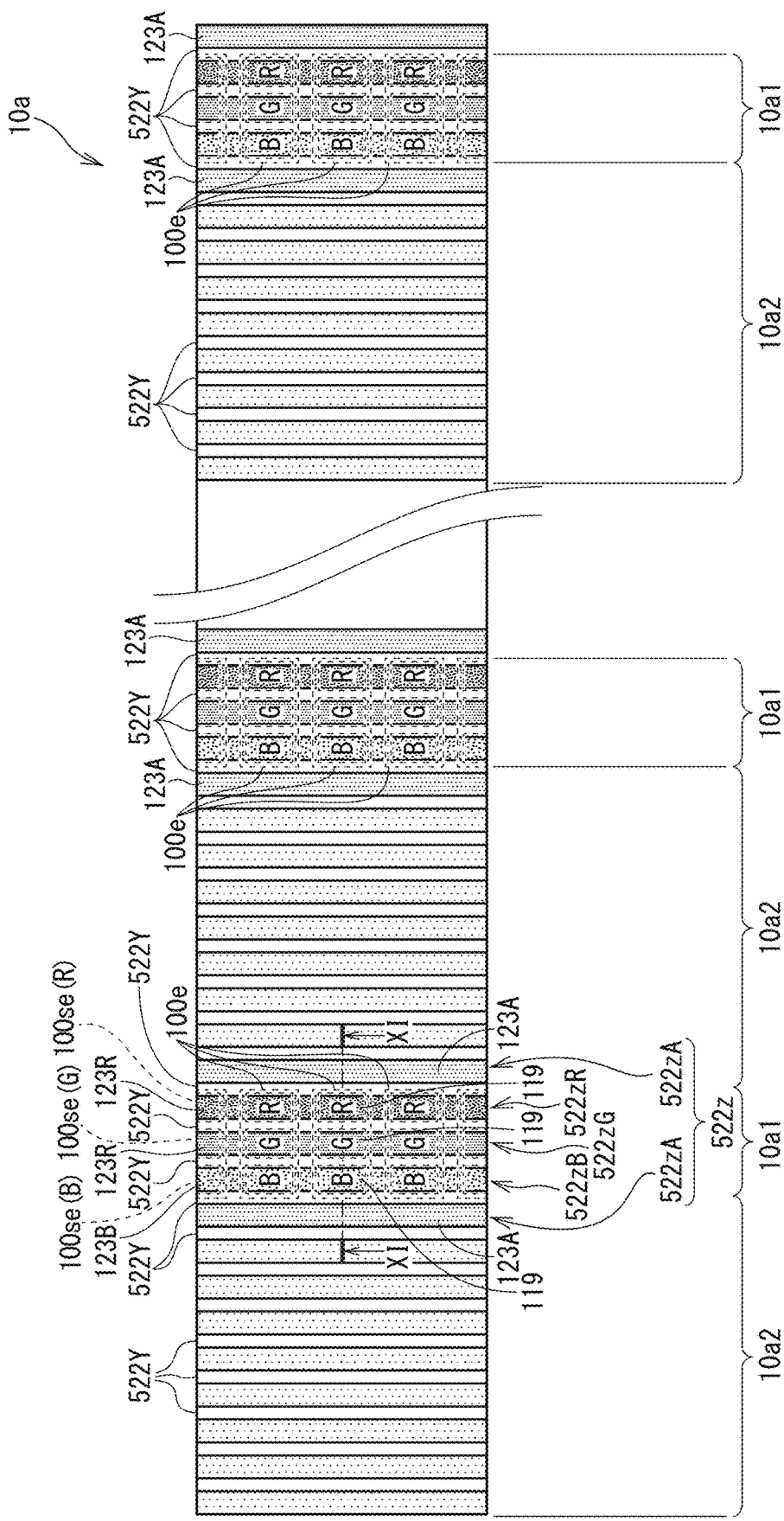
FIG. 2 is a schematic plan view diagram of a portion A from FIG. 1.

FIG. 2 is an enlargement of a portion A from FIG. 1 according to at least one embodiment. FIG. 2 is a schematic plan view diagram illustrating a portion of the image display region 10*a* of the display panel 10, and shows a state in which light emitting layers 123, an electron transport layer 124, a counter electrode 125, a sealing layer 126, and a front plate 131 are removed.

The display panel 10 has a top-emission structure in which light is emitted from a top surface thereof, and in which the organic EL elements 100, which constitute pixels, are arranged on the substrate 100*x* (TFT substrate) including thin film transistors (TFTs).

As illustrated in FIG. 2, in the pixel regions 10*a*1 of the substrate 100*x* of the display panel 10, a plurality of pixel electrodes 119 corresponding to sub-pixels 100*se* are arranged in a matrix to be separated from each other by defined distances in the row and column directions on the substrate 100*x*. Each of the pixel electrodes 119 has a rectangular shape in plan view and is made of a light reflective material that is not light transmissive. Below each of the pixel electrodes 119 is a connecting recess (contact hole, not illustrated) for connecting the pixel electrode 119 to a TFT source $S_1$.

As illustrated in FIG. 2, the display panel 10 includes column banks 522Y that partition the substrate 100*x* to define light emission units each emitting a color of light—R, G, or B. The column banks 522Y adopt a so-called line bank format, and in the pixel regions 10*a*1 the column banks 522Y extend in the column direction and are arranged side-by-side along the row direction, such that any two of the column banks 522Y adjacent in the row direction sandwich a plurality of the pixel electrodes 119. Further, in the non-pixel regions 10*a*2, the column banks 522Y are arranged side-by-side along the row direction with the same intervals between the column banks 522Y as in the pixel regions 10*a*1.

Gaps between adjacent column banks 522Y are defined as gaps 522*z*, gaps corresponding to sub-pixels 100*se* emitting B, G, R colors of light in the pixel regions 10*a*1 are defined as gaps 522*z*B, 522*z*G, 522*z*R, respectively (or "pixel gaps 522*z*P"), and gaps immediately right of the gaps 522*z*B and gaps immediately left of the gaps 522*z*R are defined as dummy gaps 522*z*A. As described later, light emitting layers 123B, 123G, 123R are formed in the gaps 522*z*B, 522*z*G, 522*z*R, respectively, and dummy light emitting layers 123A are formed in the dummy gaps 522*z*A.

Further, in order to supplement the current capacity of the counter electrode 125, auxiliary electrodes (not illustrated) may be provided that each extend continuously in the column direction along pixel columns.

Structure of Components of Image Display Region 10*a*

Figure 3:
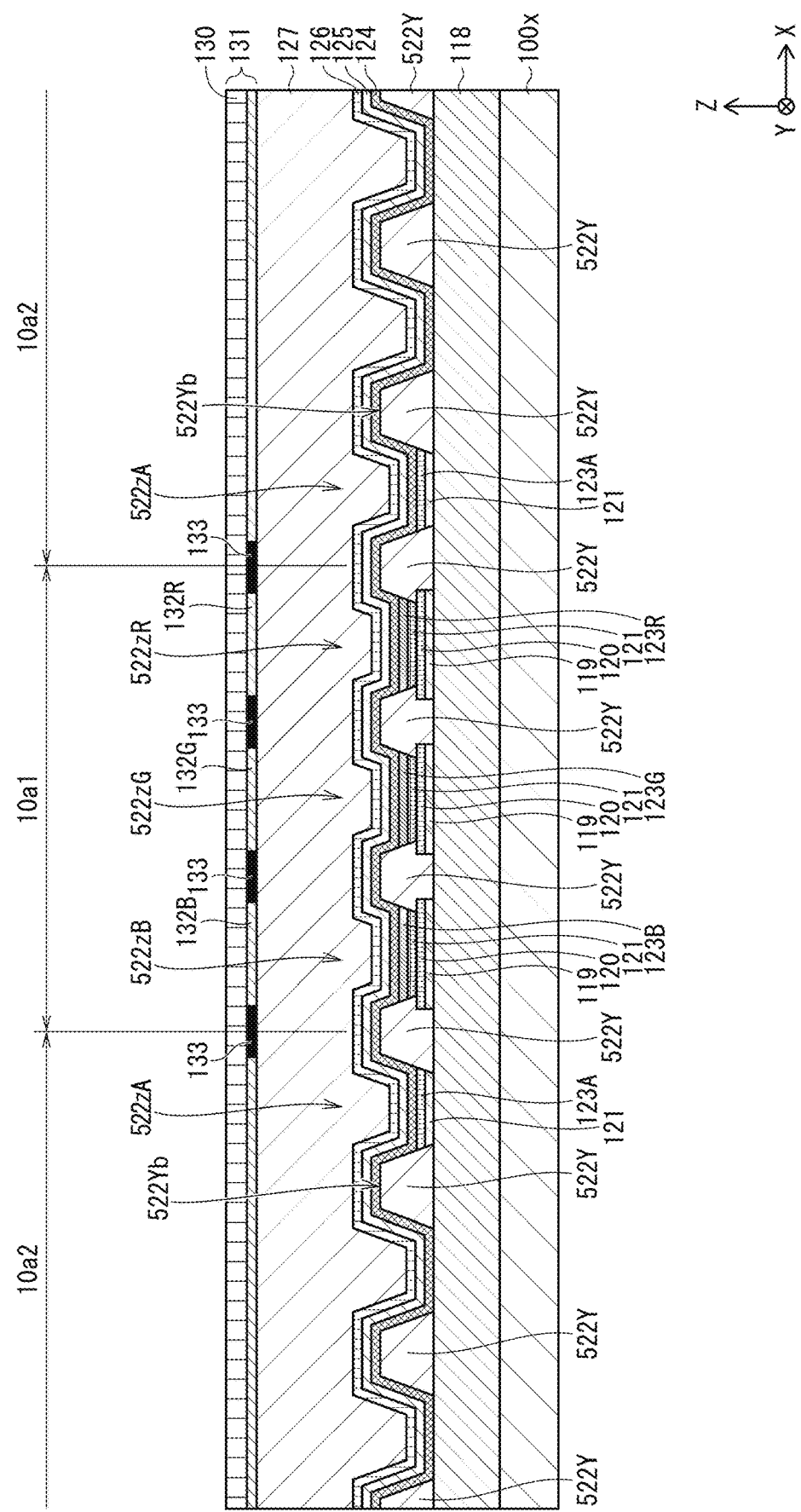
FIG. 3 is a schematic cross section diagram taken along X1-X1 from FIG. 2.

Structure of the organic EL elements 100 in the display panel 10 is described with reference to FIG. 3. FIG. 3 is a schematic cross section diagram taken along X1-X1 from FIG. 2.

As illustrated in FIG. 3, starting from a lowest point on the Z axis, the display panel 10 includes the following layers: the substrate 100*x* including thin-film transistors (TFT substrate), an organic EL element section, and a front plate 131. The organic EL element section includes the following layers: a planarizing layer 118, the pixel electrodes 119, hole injection layers 120, hole transport layers 121, the column banks 522Y, the organic light emitting layers 123, an electron transport layer 124, the counter electrode 125, and a sealing layer 126.

(Substrate 100*x*)

The substrate 100*x* is a support member of the display panel 10 and includes a base (not illustrated) and a thin film transistor layer (not illustrated) on the base.

The base is a support member of the display panel 10, and is a flat plate. As a material of the base, an electrically insulating material can be used, such as alkali-free glass, soda glass, polycarbonate resin, polyester resin, polyimide material, or alumina. Use of a light transmissive material allows use as a light transmissive display panel. Further, any thermoplastic resin or thermosetting resin may be used as a flexible plastic material.

A TFT layer is provided on the front surface of the base for each subpixel, and each forms a subpixel circuit including a TFT element. Each TFT layer has a multilayer structure including an electrode, a semiconductor layer, and an insulating layer formed on a top surface of the base.

[Planarizing Layer 118]

The planarizing layer 118 is provided on a top surface of the base and TFT layer. The planarizing layer 118 on the top surface of the substrate 100*x* ensures electrical insulation between the TFT layer and the pixel electrode 119, and planarizes even if there is a difference in height in the TFT layer (a "step"), and therefore has a function of suppressing the influence of such effects on a surface on which the pixel electrodes 119 are formed. As a material of the planarizing layer 118, an organic insulating material such as polyimide resin, acrylic resin, siloxane resin, novalac-type phenolic resin, or the like, or an inorganic insulating material such as silicon oxide (SiO), silicon nitride (SiN), or the like can be used. The planarizing layer 118 includes contact holes (not illustrated) for connecting the pixel electrodes 119 to the sources $S_1$ of the subpixel circuits of TFTs corresponding thereto.

(Organic EL Elements 100)
[Pixel Electrodes 119]

The pixel electrodes 119 corresponding to the subpixels 100se are disposed on the planarizing layer 118 disposed on a top surface of the image display region 10a of the substrate 100x.

The pixel electrodes 119 supply carriers to the light emitting layers 123. For example, if functioning as anodes, the pixel electrodes 119 supply holes to the light emitting layers 123. As a metal layer of the pixel electrodes 119, a material with low sheet resistance and high light reflectivity is used, such as silver (Ag), aluminum (Al), aluminum alloy, molybdenum (Mo), silver palladium copper alloy (APC), copper alloy, or the like. Thickness of the pixel electrodes 119 may be from 200 nm to 400 nm, for example;

The pixel electrodes 119 each have, for example, a substantially rectangular flat plate shape in plan view. In contact holes (not illustrated) of the planarizing layer 118 are formed connecting recesses of the pixel electrodes 119 that are portions of the pixel electrodes 119 recessed towards the substrate 100x, and at bottoms of the connecting recesses the pixel electrodes 119 are connected to wiring connected to sources $S_1$ of corresponding pixels.

Surfaces of the pixel electrodes may be further provided with a known light-transmissive electrically-conductive film. As a material of the light-transmissive electrically-conductive film, indium tin oxide (ITO), indium zinc oxide (IZO), or the like can be used.

[Hole Injection Layers 120]

The hole injection layers 120 are disposed on the pixel electrodes 119. The hole injection layers 120 have a function of transporting holes injected from the pixel electrode layers 119 to the hole transport layers 121.

The hole injection layers 120 include, for example, an oxide of silver (Ag), molybdenum (Mo), chromium (Cr), vanadium (V), tungsten (W), nickel (Ni), iridium (Ir), or the like, or an electrically conductive polymer material such as poly(3,4-ethylenedioxythiophene) polystyrene sulfonate (PEDOT:PSS). Thickness of the hole injection layers 120 may be from several nanometers to several tens of nanometers.

[Column Banks 522Y]

Banks made of an insulating material are formed so as to cover edges of the pixel electrodes 119 and the hole injection layers 120. Between the column banks 522Y are the gaps 522z. In the pixel regions 10a1, starting from bottoms of the pixel gaps 522zP and in this order along the Z axis, are the pixel electrodes 119, which extend in the Y direction, then as functional layers the hole injection layers 120, the hole transport layers 121, the organic light-emitting layers 123, and the electron transport layer 124. Further, among the gaps 522z in the non-pixel regions 10a2, the dummy light emitting layers 123A are formed in the dummy gaps 522zA on both sides of the pixel regions 10a1 in the row direction.

The column banks 522Y each have a line-like shape extending in the column direction, and in a cross-section taken parallel to the row direction the column banks 522Y each have a tapered trapezoid shape that tapers upwards. In the pixel regions 10a1, when the light emitting layers 123 are formed by a wet method, the column banks 522Y function as a structure that blocks flow in the row direction of ink including organic compounds that are materials of the light emitting layers 123, such that applied ink does not overflow the column banks 522Y. In the pixel regions 10a1, base portions in the row direction of the column banks 522Y define edges of the light emitting regions 100a of the sub-pixels 100se in the row direction.

The column banks 522Y are made of an electrically insulating organic material (for example, acrylic resin, polyimide resin, novolac type phenolic resin, or the like) or an electrically insulating inorganic material such as silicon oxide (SiO), silicon nitride (SiN), silicon oxynitride (SiON), or the like.

[Hole Transport Layers 121]

The hole transport layers 121 are disposed on the hole injection layers 120 in the gaps 522zR, 522zG, 522zB in the pixel regions 10a1. The hole transport layers 121 have a function of transporting holes injected from the hole injection layers 120 to the light emitting layers 123. For the hole transport layers 121, for example, a polyfluorene or a derivative thereof, a polymer compound such as a polyarylamine, which is an amine organic polymer, or a derivative thereof, poly(9,9-di-n-octylfluorene-alt-(1,4-phenylene-((4-sec-butylphenyl)imino)-1,4-phenylene) (TFB), or the like can be used.

Further, as illustrated in FIG. 3, dummy hole transport layers 121 may be formed on the planarizing layer 118 in the dummy gaps 522zA.

[Light Emitting Layers 123, Dummy Light Emitting Layers 123A]

The light emitting layers 123 are disposed on the hole transport layers 121 in the gaps 522zR, 522zG, 522zB in the pixel regions 10a1 and on the hole transport layers 121 in the dummy gaps 522zA (or on the planarizing layer 118 if the hole transport layers 121 are not present). Each of the light emitting layers 123 is a layer made of an organic compound, and has a function of emitting light generated by an excited state caused by recombination of injected holes and electrons when a voltage is applied. In the gaps 522zR, 522zG, 522zB, and the dummy gaps 522zA defined by the column banks 522Y, the light emitting layers 123 each have a line-like shape extending in the column direction. Light emitting layers 123R, 123G, 123B that emit corresponding colors of light are formed in the red gaps 522zR, the green gaps 522zG, and the blue gaps 522zB, respectively. The dummy light emitting layers 123A that do not emit light are formed in the dummy gaps 522zA.

In the display panel 10, a light emitting organic material that can be laminated by a wet printing method is used as a material of the light emitting layers 123. In particular, for example as disclosed in JP H5-163488, the light emitting layers 123 are beneficially formed by using a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth metal complex, or the like.

[Electron Transport Layer 124]

The electron transport layer 124 is laminated to cover the column banks 522Y and the light emitting layers 123 in the gaps 522z defined by the column banks 522Y. The electron transport layer 124 has a function of transporting electrons from the counter electrode 125 to the light emitting layers 123 and a function of restricting injection of electrons into the light emitting layers 123. The electron transport layer 124 is continuous across at least the entire display area of the display panel 10.

An example of an organic material that has a high electron transport property and that may be used for the electron transport layer 124 is a π electron low molecular weight organic material such as an oxadiazole derivative (OXD), a triazole derivative (TAZ), a phenanthroline derivative (BCP, Bphen), or the like. The electron transport layer 124 may include a layer made of sodium fluoride. Further, the electron transport layer 124 may include a layer doped with a metal dopant selected from alkali metals or alkaline earth metals.

[Counter Electrode 125]

The counter electrode 125 is formed on the electron transport layer 124. The counter electrode 125 is paired with the pixel electrodes 119 to form energization paths sandwiching the light emitting layers 123. The counter electrode 125 supplies carriers to the light emitting layers 123, for example when functioning as a cathode, the counter electrode 125 supplies electrons to the light emitting layers 123. In the display panel 10, the counter electrode 125 is an electrode common to each of the light emitting layers 123. The counter electrode 125 is formed by using silver (Ag), aluminum (Al), or the like as a thin film electrode. Further, in addition to a metal layer or as an alternative to the metal layer, the counter electrode 125 may include a light-transmissive electrically-conductive material such as indium tin oxide (ITO) or indium zinc oxide (IZO).

[Sealing Layer 126]

The sealing layer 126 is laminated on the counter electrode 125 so as to cover the counter electrode 125. The sealing layer 126 is for suppressing deterioration due to contact with moisture and air by the hole injection layers 120, the hole transport layers 121, the light emitting layers 123, the electron transport layers 124, and the counter electrode 125. The sealing layer 126 is disposed to cover the top surface of the counter electrode 125. In the case of a top-emission type of display panel, the sealing layer 126 is highly light-transmissive in order to ensure a good light extraction performance as a display. For example, a light-transmissive inorganic material can be used such as silicon nitride (SiN) or silicon oxynitride (SiON). Further, a sealing resin layer made of a resin material such as acrylic resin, silicone resin, or the like may be provided on the light-transmissive inorganic layer.

[Joining Layer 127]

Above the sealing layer 126 is a front plate 131 including an upper substrate 130 and a color filter layer 132 disposed below the upper substrate 130. The front plate 131 is joined to the sealing layer 126 by a joining layer 127. The joining layer 127 has a function of joining the front plate 131 to the layers from the substrate 100x to the sealing layer 126, and has a function of preventing each layer from being exposed to moisture and air. For the joining layer 127, a light-transmissive resin material such as acrylic resin, silicone resin, epoxy resin, or the like can be used.

Components of Front Plate 131

[Upper Substrate 130]

The front plate 131, which includes the upper substrate 130 and the color filter layer 132, is disposed on and joined to the joining layer 127. In a top-emission type of display panel, for example, a light-transmissive material such as cover glass, light-transmissive resin film, or the like is used for the upper substrate 130. Further, the upper substrate 130 can improve rigidity of the display panel 10, and help prevent intrusion of moisture, air, and the like.

[Color Filter Layer 132]

The color filter layer 132 is formed on the upper substrate 130 at positions corresponding to each of the light emitting regions 100a of pixels. The color filter layer 132 is a light-transmissive layer provided for allowing transmission of visible light of wavelengths corresponding to R, G, and B and has a function of transmitting light emitted from each color pixel to correct chromaticity of the transmitted light. In the present example, red, green, and blue color filter layers 132R, 132G, 132B are formed above the gaps 522zR, 522zG, 522zB, respectively. As the color filter layer 132, a known resin material (as a commercially available product example, color resists manufactured by JSR Corporation) or the like can be used.

[Light Shielding Layer 133]

The light shielding layer 133 is formed on the upper substrate 130 in positions corresponding to boundaries between light emitting regions 100a of pixels. The light shielding layer 133 is a black resin layer provided to prevent transmission of visible light of wavelengths corresponding to R, G, and B. For example, the light shielding layer 133 is made of a resin material including black pigment with excellent light absorption and light shielding properties. The light shielding layer 133 is made of a resin material that is primarily an ultraviolet curable resin (for example, ultraviolet curable acrylic resin) material to which a light shielding black pigment is added, such as carbon black pigment, titanium black pigment, metal oxide pigment, organic pigment, or the like.

Method of Manufacturing Display Panel 10

A method of manufacturing the display panel 10 is described with reference to FIG. 4 to FIG. 11B. FIG. 4 is a flowchart of manufacturing of the display panel 10 according to at least one embodiment. Each of the drawings in FIG. 5A to FIG. 11B is a schematic cross section taken at a position corresponding to X1-X1 in FIG. 2 (the image display region 10a) illustrating a state in a process of manufacturing the display panel 10.

[Forming Substrate 100x]

Figure 5A:
FIGS. 5A, 5B, 5C, and 5D are schematic cross section diagrams taken from the same location as X1-X1 in FIG. 2 illustrating states in manufacturing of the organic EL display panel 10 according to at least one embodiment.

A plurality of TFTs and wiring (TFT layers) are formed on the substrate 100x (step S1 in FIG. 4; FIG. 5A).

[Forming Planarizing Layer 118]

Figure 5B:
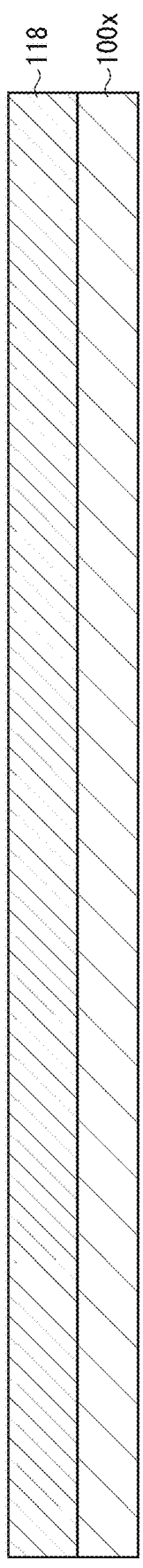

The planarizing layer 118 is formed by coating the substrate 100x with a component material (photosensitive resin material) of the planarizing layer 118 as a photoresist, and by planarizing the coated surface (step S2 in FIG. 4; FIG. 5B). More specifically, a resin material having a certain fluidity is applied by, for example, a die coating method along a top surface of the substrate 100x so as to fill unevenness of the substrate 100x caused by the TFT layer, then the resin material is baked.

Contact holes (not illustrated) are formed by dry etching of the planarizing layer 118 at locations corresponding to TFT elements, for example above source electrodes. The contact holes are formed by using patterning or the like, so that the bottoms of the contact holes expose top surfaces of the source electrodes.

Subsequently, connecting electrodes are formed along inner walls of the contact holes 002E A portion of each of the connecting electrodes is disposed on the planarizing layer 118. For example, a sputtering method can be used to form a connecting electrode layer. After forming a metal thin film, patterning can be performed by using a photolithography method and a wet etching method.

[Forming Pixel Electrodes 119, Hole Injection Layers 120]

The following describes formation of the pixel electrodes 119 and the hole injection layers 120.

After forming the planarizing layer 118, a surface of the planarizing layer 118 is dry-etched to perform pre-film forming cleaning.

Figure 5C:
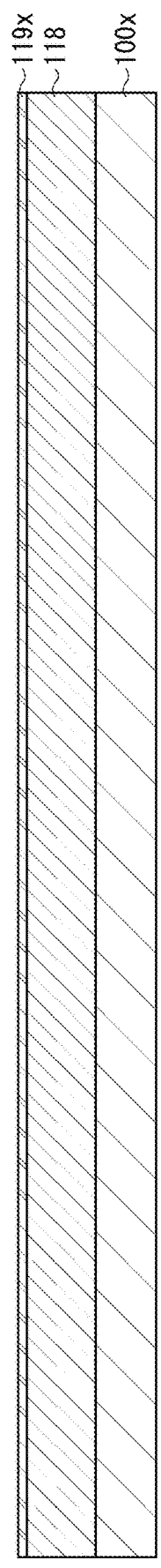

Next, after the pre-film forming cleaning of the surface of the planarization layer 118, a pixel electrode metal film 119$x$ for forming the pixel electrodes 119 is formed on the surface of the planarization layer 118 in the pixel regions 10$a$1, by a vapor phase growth method such as a sputtering method or vacuum deposition (step S3 in FIG. 4; FIG. 5C). According to the present embodiment, the metal film 119$x$ is made of aluminum or an alloy that is primarily aluminum by using a sputtering method. After film formation, baking may be performed.

Figure 5D:
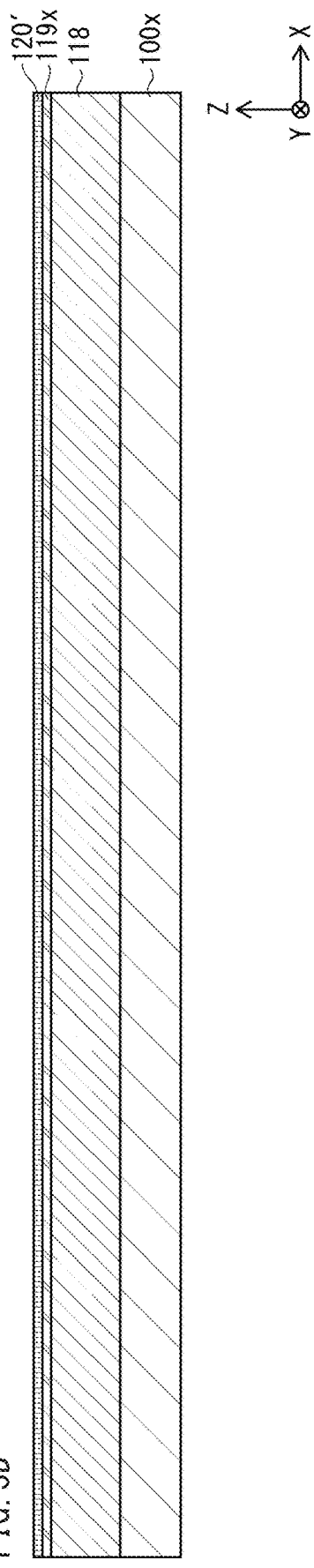

Further, after pre-film-forming cleaning of a surface of the metal film 119$x$, a metal film 120' for forming the hole injection layers 120 is formed on the surface of the metal film 119$x$ in the pixel regions 10$a$1, by a vapor phase growth method in a vacuum environment (step S4, FIG. 4; FIG. 5D). According to the present embodiment, the metal film 120' is formed by sputtering tungsten. After film formation, baking may be performed.

Figure 6A:
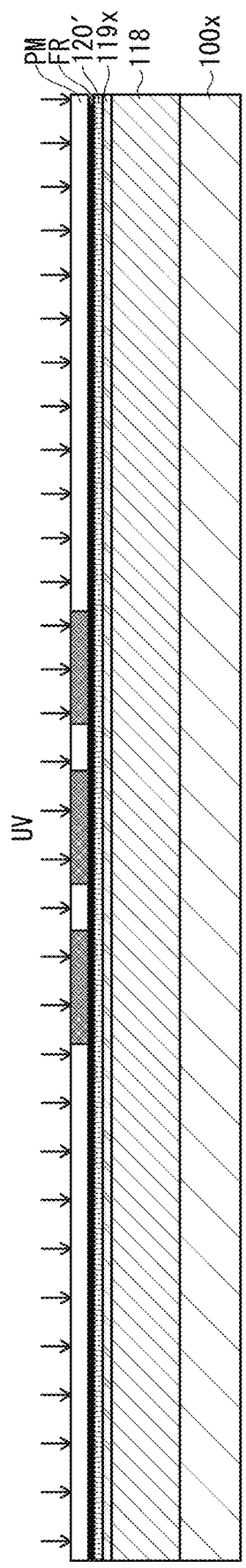
FIGS. 6A and 6B are schematic cross section diagrams taken from the same location as X1-X1 in FIG. 2 illustrating states in manufacturing of the organic EL display panel 10 according to at least one embodiment.

Subsequently, after applying a photoresist layer FR made of a photosensitive resin or the like, a photomask PM provided with defined openings is disposed thereon and irradiated with ultraviolet light to expose the photoresist and transfer the pattern of the photomask to the photoresist (FIG. 6A). Next, the photoresist layer FR is patterned by developing.

Next, through the patterned photoresist layer FR, the metal film 120' is subjected to dry etching processing to perform patterning, forming the hole injection layers 120 in the pixel regions 10$a$1.

Next, through the patterned photoresist layer FR, the metal film 119$x$ is subjected to wet etching processing to perform patterning, forming the pixel electrodes 119 in the pixel regions 10$a$1.

Figure 6B:
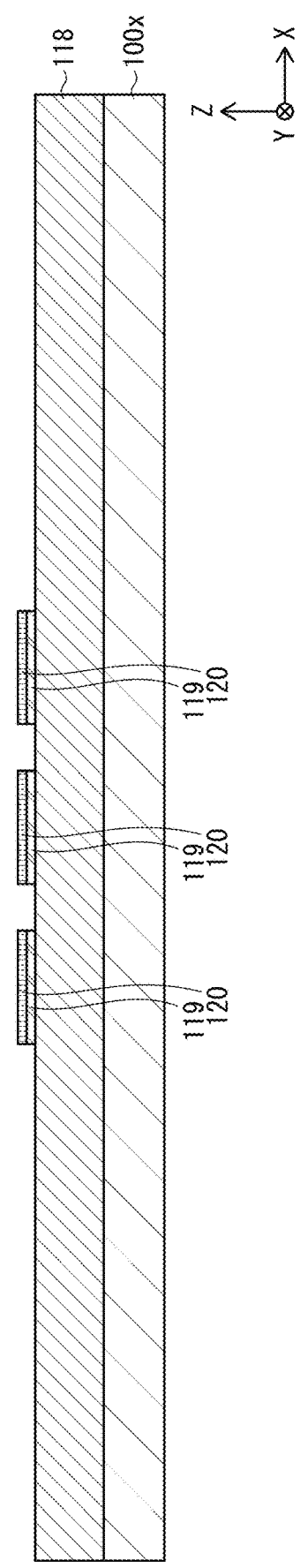

Finally, the photoresist layer FR is removed, leaving laminated stacks of the pixel electrodes 119 and the hole injection layers 120 patterned to have the same shapes as each other in the pixel regions 10$a$1 (step S5 in FIG. 4; FIG. 6B).

[Forming Column Banks 522Y]

Figure 7A:
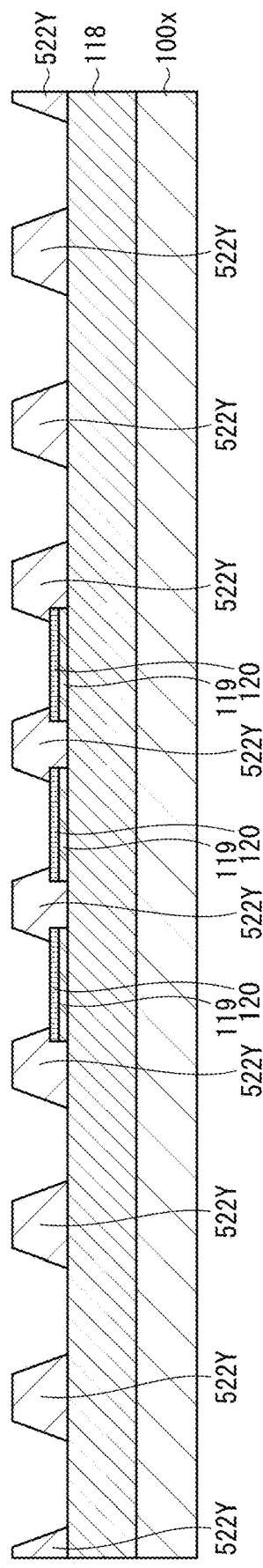
FIGS. 7A and 7B are schematic cross section diagrams taken from the same location as X1-X1 in FIG. 2 illustrating states in manufacturing of the organic EL display panel 10 according to at least one embodiment.

After the hole injection layers 120 are formed, the column banks 522Y are formed so as to cover the hole injection layers 120. In forming the column banks 522Y, a film made of a material of the column banks 522Y (for example, a photosensitive resin material) is laminated on the hole injection layers 120 by using a spin coating method or the like. Next, a mask is disposed above the film and exposed to light. Developing is then performed, thereby patterning the film to form the gaps 522$z$ and the column banks 522Y (step S6 in FIG. 4; FIG. 7A). At this time, in a baking process applied to the column banks 522Y, metals are oxidized and the hole injection layers 120 are completed.

[Forming Organic Functional Layers]

In the pixel regions 10$a$1, the hole transport layers 121 and the light emitting layers are laminated in this order onto the hole injection layers 120 formed in the pixel gaps 522$z$P defined by the column banks 522Y. In the non-pixel regions 10$a$2, the hole transport layers 121 are formed on the planarizing layers 118 in the dummy gaps 522$z$A.

Figure 7B:
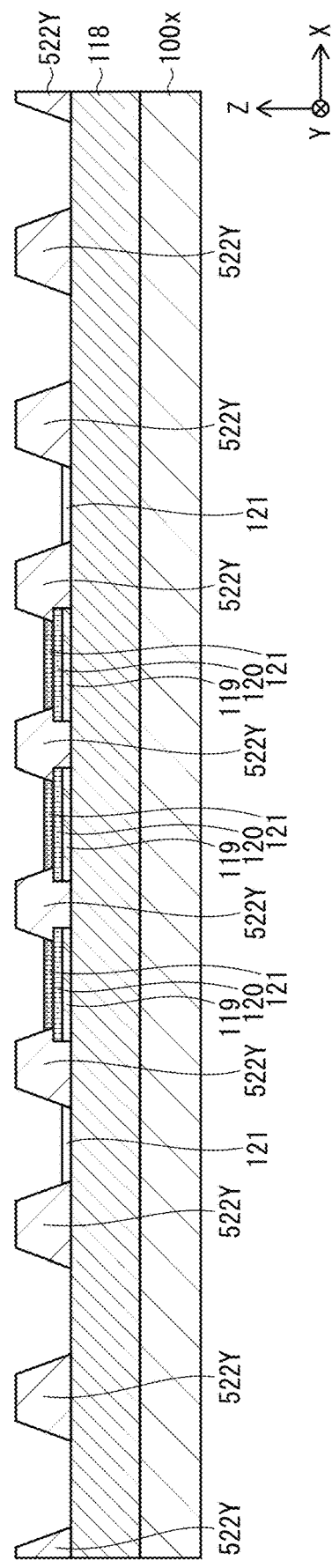

The hole transport layers 121 are formed by using a wet process such an inkjet method or gravure printing method to apply ink including a material of the hole transport layers 121 into the pixel gaps 522$z$P and the dummy gaps 522$z$A defined by the column banks 522Y, then removing a solvent of the ink by volatilization or by baking (step S7 of FIG. 4; FIG. 7B). The hole transport layers 121 formed in each RGB sub-pixel may be formed to have different film thicknesses from each other.

The light emitting layers 123 are formed by using an inkjet method to apply ink including a material of the light emitting layers 123 into the pixel gaps 522$z$P and the dummy gaps 522$z$A defined by the column banks 522Y, then baking (step S8 in FIG. 4; FIG. 8A).

More specifically, the substrate 100$x$ is placed on an operation table of a droplet discharge device such that the column banks 522Y are aligned with the Y direction. An inkjet head 301 that has a plurality of nozzle holes in a line aligned with the Y direction and the substrate 100$x$ are moved relative to each other in the X direction while droplets of ink 18 from the nozzle holes are caused to land on landing targets set in the pixel gaps 522$z$P and the dummy gaps 522$z$A between the column banks 522Y.

In this process, the ink 18 including material of any one of the blue (B), green (G), and red (R) organic light emitting layers fills the gaps 522$z$B, 522$z$G, 522$z$R, and the dummy gaps 522$z$A, which are sub-pixel formation regions, by an inkjet method. The ink is dried under low pressure and baked to form the light emitting layers 123R, 123G, 123B, and the dummy light emitting layers 123A. The ink in the dummy gaps 522$z$A may be the ink 18 including the material of any one of the blue (B), green (G), and red (R) organic light emitting layers.

Upon completion of application of ink for forming any one of the red light emitting layers, the green light emitting layers, and the blue light emitting layers with respect to the substrate 100$x$, another color of ink is applied with respect to the substrate 100$x$, then the third color of ink is applied. By repeating this process, three colors of ink are applied in order. The ink application into the dummy gaps 522$z$A may be performed in the same process of the inkjet head 301 applying ink including the material of any one of the blue (B), green (G), and red (R) organic light emitting layers. As a result, the blue light emitting layers 123B, the green light emitting layers 123G, the red light emitting layers 123R, and the dummy light emitting layers 123A are formed above the substrate 100$x$ along the X direction.

Note that the method for forming the hole transport layers 121 and the light emitting layers 123 on the hole injection layers 120 is not limited to a method described above, and known methods such as a dispenser method, a nozzle coating method, a spin coating method, intaglio printing, relief printing, and the like may be used to drop and/or apply ink.

Before forming the hole transport layers 121, an ink including an electrically conductive polymer material such as poly(3,4-ethylenedioxythiophene) polystyrene sulfonate (PEDOT:PSS) may be applied into the gaps 522$z$, then solvent of the ink volatilized to remove the solvent, or baked.

[Forming Electron Transport Layer 124]

After forming the light emitting layers 123, the electron transport layer 124 is formed over the entirety of a light emitting area (image display region 10a) of the display panel 10 by vacuum deposition or the like (step S9 in FIG. 4; FIG. 8B).

Reasons for using vacuum deposition are to avoid damage to the light emitting layers 123, which are organic, and because, in a vacuum deposition method performed under high vacuum, molecules to form a film proceed directly in a direction normal to the substrate. The electron transport layer 124 is formed by depositing a metal oxide or fluoride on the light emitting layers 123 by a vacuum deposition method or the like. Alternatively, the electron transport layer 124 may be formed by co-deposition of an organic material and a metal material. Note that film thickness of the electron transport layer 124 is set to be a film thickness most appropriate for optical light extraction.

[Forming Counter Electrode 125]

After forming the electron transport layer 124, the counter electrode 125 is formed so as to cover the electron transport layer 124 (step S10 in FIG. 4; FIG. 9A. The counter electrode 125 is formed by a chemical vapor deposition (CVD) method, a sputtering method, or a vacuum deposition method so that a film that is primarily metal and metal oxide covers the electron transport layer 124.

[Forming Sealing Layer 126]

The sealing layer 126 is formed so as to cover the counter electrode 125 (step S11 in FIG. 4; FIG. 9B). The sealing layer 126 can be formed by using a CVD method, a sputtering method, or the like.

[Forming Front Plate 131]

In manufacturing of the front plate 131, a light-transmissive upper substrate 130 is prepared, and a light shielding layer material (133X) made of primarily an ultraviolet light curable resin (for example, an ultraviolet light curable acrylic resin) with an added black pigment component is applied onto the light-transmissive upper substrate 130 (FIG. 10A). A pattern mask PM having defined openings is overlaid on an upper surface of a light shielding layer material film 133' and is irradiated from above with ultraviolet light (FIG. 10B). Then, by removing the pattern mask PM and uncured portions of the light shielding layer material film 133', developing, and curing, the light shielding layer 133 is completed and has, for example, substantially rectangular shapes in cross section (FIG. 10C). Next, for example, a material 132G of the color filter layer 132 made of primarily an ultraviolet light curable resin component is applied on a surface of the upper substrate 130 (on which the light shielding layer 133 is formed) (FIG. 10D), then a defined pattern mask PM is placed and ultraviolet light irradiation is performed (FIG. 10E). Subsequently, curing is performed, and the pattern mask PM and uncured portions of the material 132G are removed by developing to form the color filter layer 132G (FIG. 10F). By repeating this process for each color of color filter material, the color filter layers 132R, 132B are formed (FIG. 10G). Thus, the front plate 131 is formed (step S12 in FIG. 4).

[Joining Front Plate 131 and Back Panel]

Figure 11A:
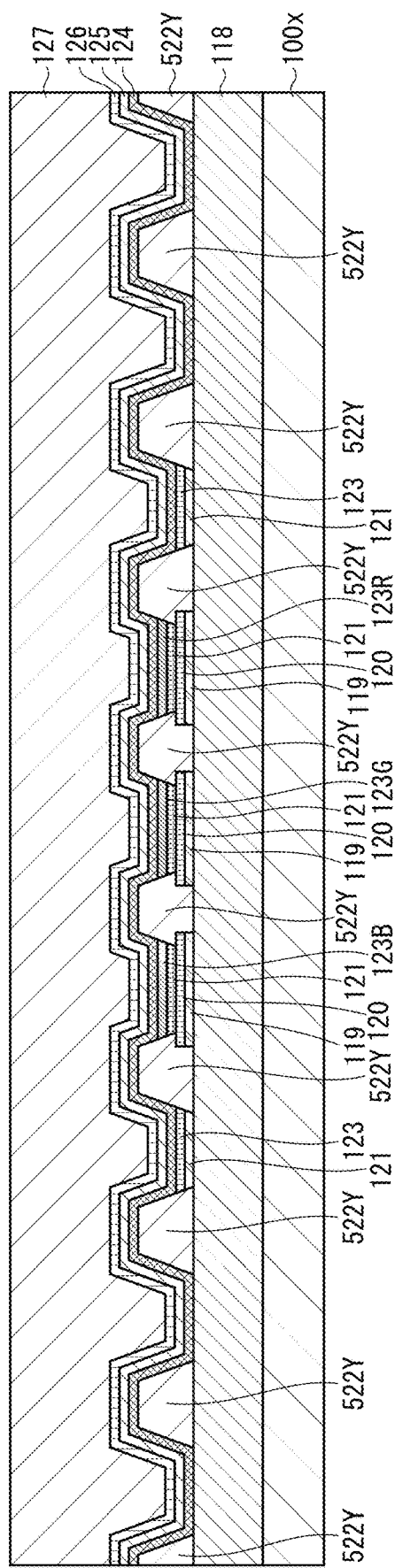
FIGS. 11A and 11B are schematic cross section diagrams taken from the same location as X1-X1 in FIG. 2 illustrating states in manufacturing of the organic EL display panel 10 according to at least one embodiment.

Next, a material of the joining layer 127 that is primarily an ultraviolet light curable resin such as acrylic resin, silicone resin, epoxy resin, or the like, is applied to a back panel that includes every layer from the substrate 100x to the sealing layer 126 (FIG. 11A).

Figure 11B:
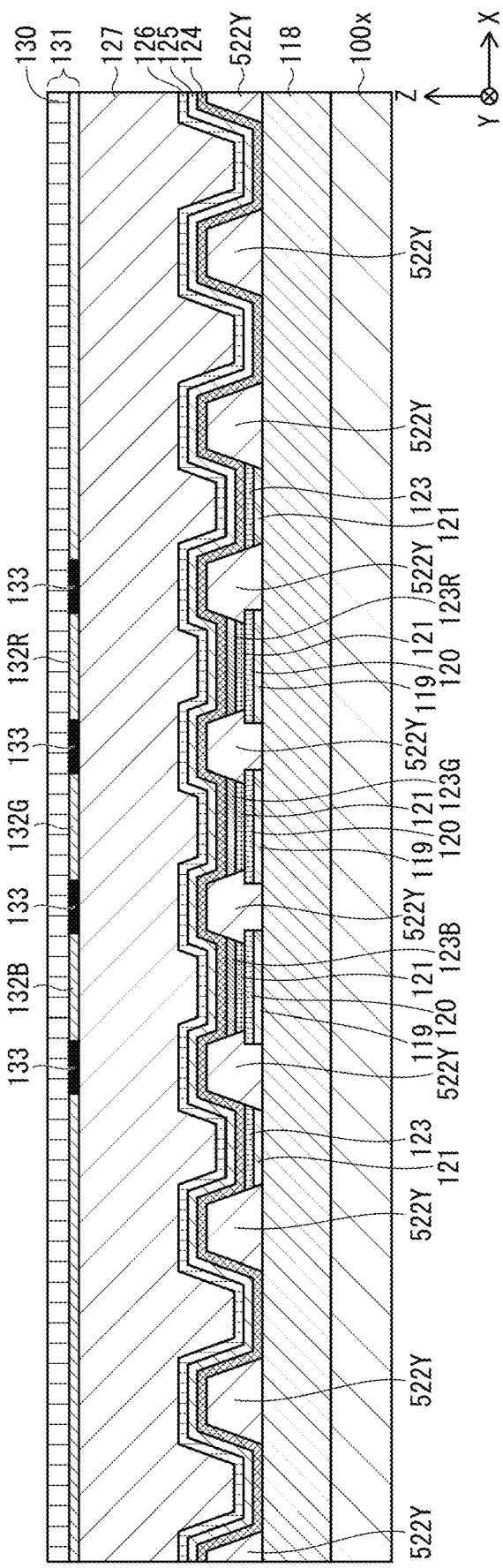

Next, the applied material is irradiated with ultraviolet light, and the back panel and the front panel 131 are joined while matching positions relative to each other. Subsequently, the display panel 10 is completed by baking both panels to complete the sealing process (step S13 in FIG. 4; FIG. 11B).

<Effects>

(Influence of Dummy Light Emitting Layers in Formation of Light Emitting Layers)

The following describes effects of the display panel 10.

FIG. 12A is a schematic cross section diagram illustrating a process of forming light emitting layers of the display panel 10 according to at least one embodiment, and FIG. 12B is a schematic cross section diagram illustrating a process of forming light emitting layers of a display panel 10X pertaining to a reference example. Both FIG. 12A and FIG. 12B illustrate schematic cross sections taken along the same X1-X1 line in FIG. 2.

The display panel 10X pertaining to the reference example is different from the display panel 10 in that the dummy light emitting layers 123A and the hole transport layers 121 are not formed in the gaps $522z$ on either side of the pixel gaps $522z$P. Accordingly, in the display panel 10X, each of the non-pixel regions 10a2 is light-transmissive across a total width thereof. Otherwise, structure of the display panel 10X is the same as structure of the display panel 10. In the display panel 10X, the light emitting layers 123 are formed by first applying an ink including a material of the light emitting layers 123 into the pixel gaps $522z$P defined by the column banks 522Y by an inkjet method, then baking.

In the display panel 10X, as illustrated in FIG. 12B, when solvent of ink of the light emitting layers 123 applied to the pixel gaps $522z$P in the pixel regions 10a1 on the substrate 100x evaporates, evaporation speed is relatively fast in the peripheral portions of the pixel regions 10a1, and drying of the solvent starts from the peripheral portions. A reason for this is that, in a wet process of evaporating and drying the solvent of the ink, when comparing a central portion of the film formation area to the peripheral portion, solvent vapor pressure is lower in the peripheral portion than the central portion, and therefore solvent evaporation speed is fast. Here, the film formation area is an area where ink is applied by a wet process, and is the same area as the pixel regions 10a1 illustrated in FIG. 12a1.

In a light-transmissive display panel, the pixel regions 10a1 and the non-pixel regions 10a2 having a size equal to or larger than the pixel regions 10a1 alternate along the row direction, and therefore in the pixel regions 10a1, which are film formation areas, a difference in decrease in solvent vapor pressure between the peripheral portions and the central portions becomes significant. Thus, among the gaps $522z$B, $522z$G, $522z$R, which constitute the pixel gaps $522z$P, in the gaps $522z$B, $522z$R that are close to the boundaries with the non-pixel regions 10a2, solvent evaporation due to drying proceeds faster for ink nearer the edges of the pixel regions 10a1 (outward ink portions) than ink farther from the edges of the pixel regions 10a1 (inward ink portions), and an amount of residual solvent per unit area decreases. Then, in the drying process, ink convection occurs from the inward ink portions towards the outward ink portions to compensate for the solvent decrease, causing movement of solvent including organic light emitting material from the inward ink portions to the outward ink portions. As a result, as illustrated in FIG. 12B, in the display panel 10X, among the pixel gaps $522z$P in the pixel regions 10a1, ink film thickness increases in the gaps $522z$B, $522z$R near the boundaries with the non-pixel regions 10a2, towards the edges of the pixel regions 10a1.

In such a case, in a sub-pixel corresponding to the gaps 522zB, 522zR, imbalance in film thickness of the light emitting layer occurs in the sub-pixel, and average film thickness required for sub-pixels is not obtained, leading to a decrease in brightness of the sub-pixel. In particular, when an imbalance occurs in film thickness of a light emitting layer in a sub-pixel, a large brightness variation occurs when the sub-pixel is viewed from an oblique angle.

A reason for this is that even when a viewing angle is the same, thickness of the sub-pixel in a direction perpendicular to the field of view is different depending on whether the sub-pixel is viewed from a direction of thin film thickness or from a direction of thick film thickness, leading to changes in visible brightness. Accordingly, when a mix of sub-pixels have thicknesses that are unbalanced to different extents and in different directions, large brightness differences occur depending on the direction and extent of sub-pixel imbalance when viewed from an oblique angle. In the case of a light-transmissive display panel on which an image of an object on a back side of the display panel (background object) can be visually recognized, a viewer will often view the display panel from a position where the background object can be easily seen. In this case, an angle between the display panel and the viewer, that is, a viewing angle of the viewer with respect to a display image, also varies depending on a positional relationship between the viewer and the background object. Thus, when compared to a reflective display panel, visibility of a display image when viewed from an oblique angle is of greater importance.

In contrast, in the display panel 10 pertaining to an embodiment, as illustrated in FIG. 12A, the dummy light emitting layers 123A and the hole transport layers 121 are formed in the dummy gaps 522zA on either side of the pixel gaps 522zP in the row direction. Accordingly, the display panel 10 has a structure exhibiting lower light transmission in portions corresponding to the dummy gaps 522zA in the non-pixel regions 10a2.

Due to this structure, it is possible to suppress the phenomenon in which ink of the light emitting layers 123 applied to the pixel gaps 522zP in the pixel regions 10a1 on the substrate 100x has a relatively high solvent evaporation rate in the peripheral portions of the pixel regions 10a1, causing solvent drying to start from the peripheral portions.

This is because, in the display panel 10, film formation areas where ink is applied by a wet process are areas including the dummy gaps 522zA in addition to the pixel regions 10a1, as illustrated in FIG. 12A. Thus, in a process of evaporating and drying ink solvent, in dummy gaps 522zA located in the peripheral portions of film formation areas, solvent evaporation of ink portions positioned farther from edges of the non-pixel regions 10a2 (non-pixel inward ink portions) due to drying proceeds faster than solvent evaporation of ink portions positioned nearer edges of the non-pixel regions 10a2 (non-pixel outward ink portions). As the solvent evaporates, an amount of residual solvent per unit area decreases, ink convection occurs from the non-pixel outward ink portions towards the non-pixel inward ink portions to compensate for the solvent decrease, causing movement of solvent including organic light emitting material from the non-pixel outward ink portions to the non-pixel inward ink portions. As a result, as illustrated in FIG. 12A, in the display panel 10, ink thickness increases in the inward portions of the dummy gaps 522zA in the non-pixel regions 10a2.

However, among the gaps 522zB, 522zG, 522zR that constitute the pixel gaps 522zP, in the gaps 522zB, 522zR nearest the boundaries with the non-pixel regions 10a2, a decrease in solvent vapor pressure in peripheral portions relative to central portions is suppressed by the presence of the ink of the dummy light emitting layers 123A applied to the dummy gaps 522zA. Thus, in the gaps 522zB, 522zR, differences in evaporation rates of solvent between the outward ink portions and the inward ink portions in the pixel regions 10a1 are significantly reduced when compared to the reference example.

Thus, among the pixel gaps 522zP in the pixel regions 10a1, increases in ink film thickness of outward ink portions in the pixel regions 10a1 are suppressed for the gaps 522zB, 522zR that are near the boundaries with the non-pixel regions 10a2. As a result, the occurrence of large brightness differences can be suppressed, when the large brightness differences are caused by a mix of sub-pixels having thicknesses that are unbalanced to different extents and in different directions and depend on the direction and extent of sub-pixel thickness imbalances when viewed from an oblique angle. Thus, visibility from an oblique angle can be improved, and the display panel 10 pertaining to at least one embodiment can be used as a light-transmissive display panel requiring higher visibility when viewed from an oblique angle than a reflective display panel.

(Experimental Confirmation of Effects)

The following describes results of experimental confirmation of effects achieved by using the display panel 10.

[Experimental Methods]

Figure 13A:
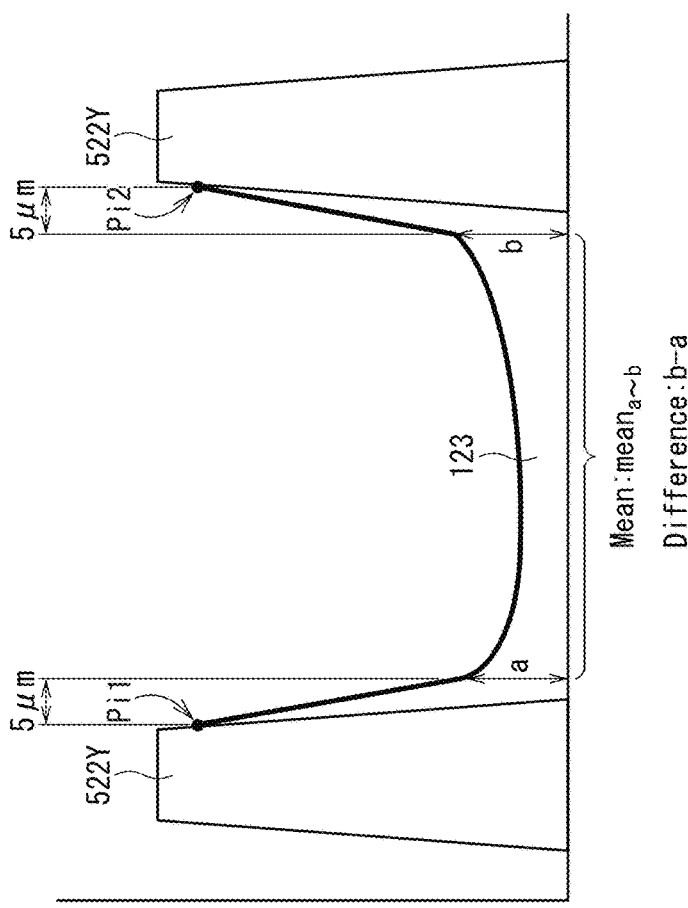
FIG. 13A is a schematic plan view diagram illustrating measurement positions of a cross-section profile of a light emitting layer in one organic EL display panel for embodiments 1 and 2 of the organic EL display panel 10 and a reference example.
Figure 13B:
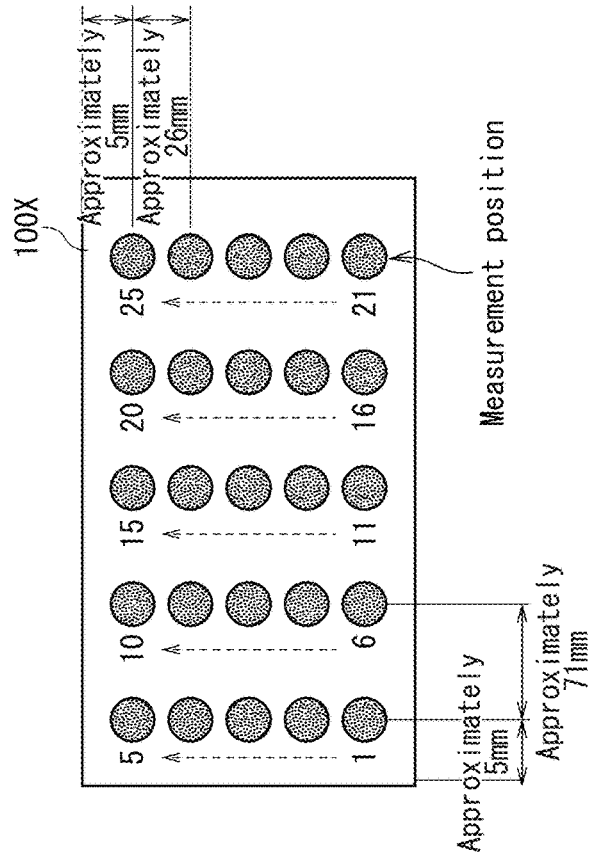
FIG. 13B is a schematic cross section diagram illustrating height measurement positions of surfaces of one organic EL light emitting layer.

The inventor measured a cross-section profile of the light emitting layers 123 of the display panel 10 by using an atomic force microscope (AFM). FIG. 13A is a schematic plan view diagram illustrating measurement positions of a cross-section profile of a light emitting layer in one organic EL display panel for embodiments 1 and 2 of the organic EL display panel 10 and a reference example; and FIG. 13B is a schematic cross section diagram illustrating height measurement positions of surfaces of one organic EL light emitting layer. In this experiment, cross section profiles of light emitting layers 123 on center lines in the X direction of sub-pixels 100se of a display panel were measured at measurement positions 1-25 illustrated in FIG. 13A. Differences between heights a and b (b–a) of light emitting layers at positions 5 µm from pinning positions Pi1, Pi2 on side surfaces of the column banks 522Y, and average values $mean_{a-b}$ of heights of light emitting layers between positions 5 µm from the pinning positions Pi1, Pi2 were calculated.

[Test Samples]

The following describes specifications of embodiments and reference examples 1 through 3.

Embodiment 1 is a display panel for which an inkjet method was used in forming the light emitting layers 123, in which a defined amount of ink including a constituent material was dropped into the pixel gaps 522zP defined by the column banks 522Y. After also dropping/applying blue (B), green (G), or red (R) ink into each of the dummy gaps 522zA up to an overflow limit, baking was performed. Ink application into the dummy gaps 522zA was performed during scanning of the same inkjet head used in ink application of the same color to the pixel gaps 522zP.

Embodiment 2 is a display panel for which an inkjet method was used in forming the light emitting layers 123, in which a defined amount of ink including a constituent material was dropped into the pixel gaps 522zP defined by the column banks 522Y. After also dropping/applying only a defined amount of blue (B) ink into the dummy gaps 522zA next to the gaps 522zR, baking was performed. Ink application into the dummy gaps 522zA was performed during scanning of the same inkjet head used in ink application of blue (B) ink to the pixel gaps 522zP.

The reference example is a display panel for which an inkjet method was used in forming the light emitting layers 123, in which a defined amount of ink including a constituent material was dropped into the pixel gaps 522zP defined by the column banks 522Y, after which baking was performed.

[Measurement Results]

Figure 14C:
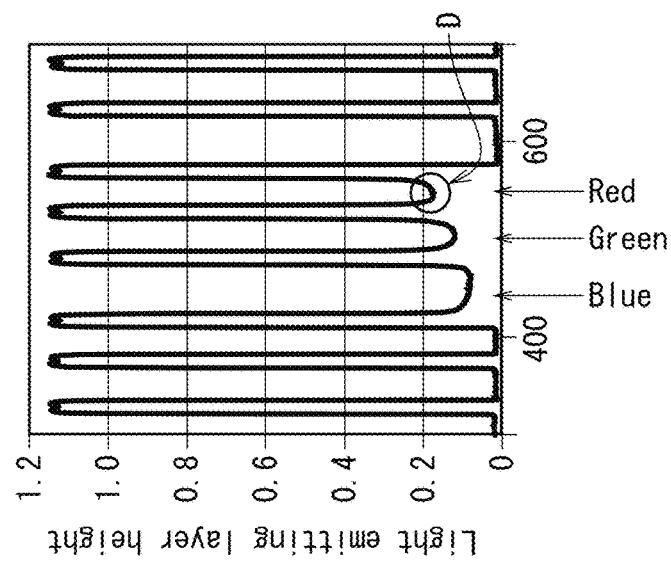
FIGS. 14A, 14B, and 14C illustrate cross-section profile measurement results for column banks and light emitting layers of embodiments 1 and 2 of the organic EL display panel 10 and a reference example.
Figure 14B:
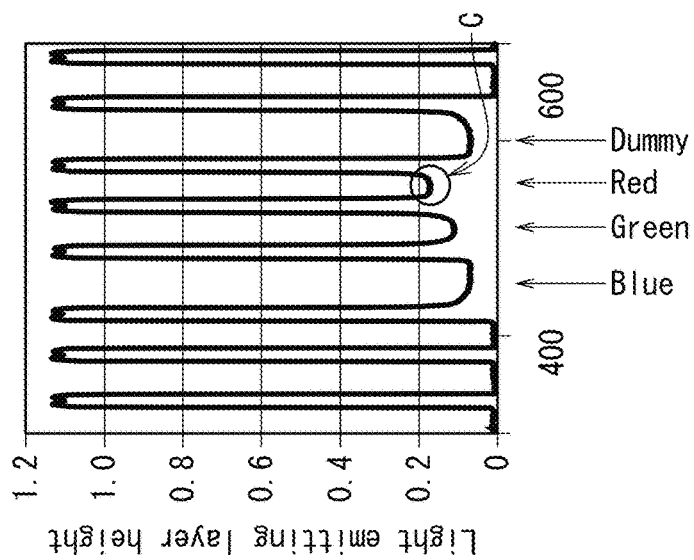
Figure 14A:
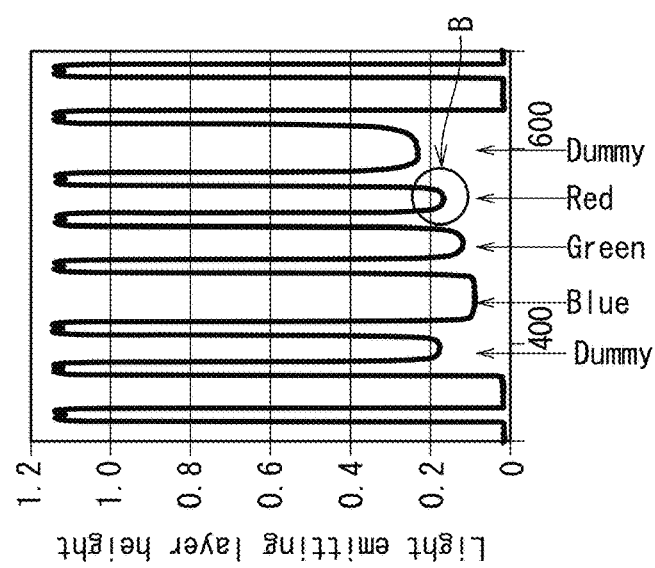

FIGS. 14A, 14B, and 14C illustrate cross-section profile measurement results for column banks and light emitting layers of Embodiments 1 and 2 of the organic EL display panel 10 and a reference example, respectively.

When comparing red (R) light emitting layers, in the reference example (FIG. 14C, indicated by D), the light emitting layer has a cross section profile that is curved in a concave shape, and height of the light emitting layer inclines to be higher towards the right of the concave shape (towards an edge of the pixel region). In Embodiment 2 (FIG. 14B, indicated by C), the red (R) light emitting layer has a cross section profile in which a degree of incline in the concave shape is smaller than in the reference example. In Embodiment 1 (FIG. 14A, indicated by B), the red (R) light emitting layer has a cross section profile in which the incline in the concave shape is further reduced and left and right heights are almost equal.

Figure 15A:
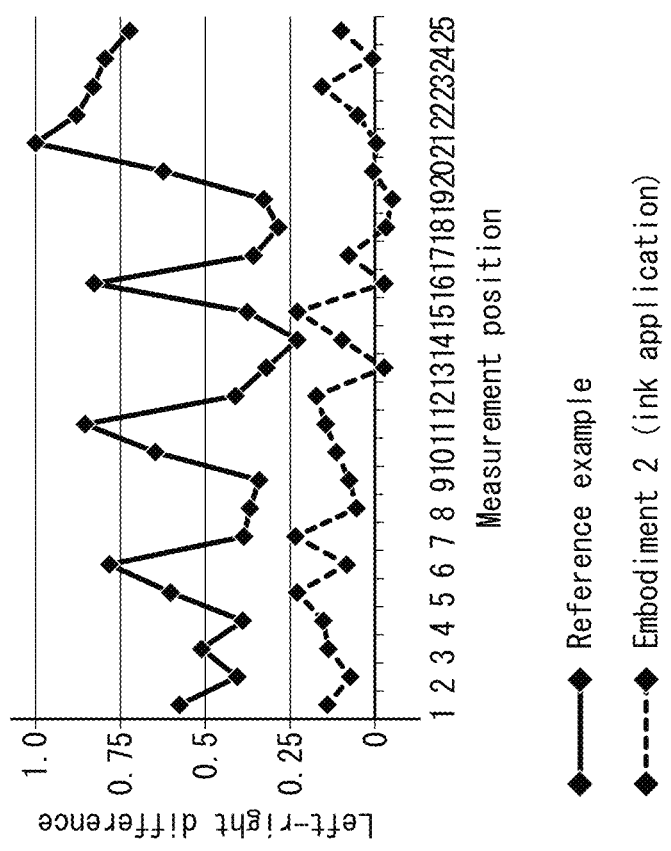
FIG. 15A illustrates differences between heights a and b (b−a) of light emitting layers at measurement positions for embodiment 1 of the organic EL display panel 10.
Figure 15B:
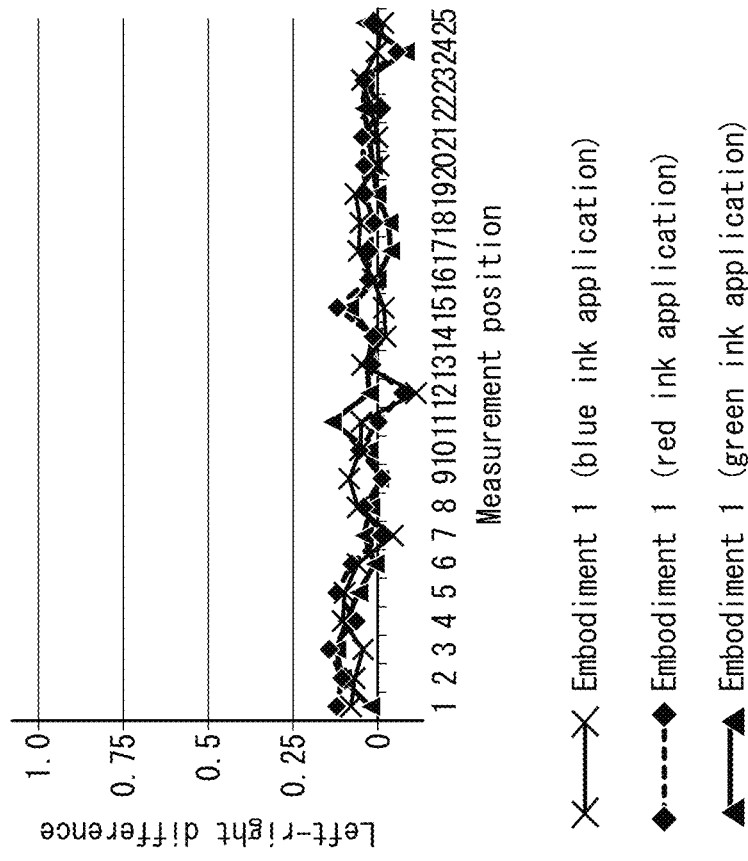
FIG. 15B illustrates differences between heights a and b (b−a) of red light emitting layers at measurement positions for embodiment 2 of the organic EL display panel 10 and a reference example.

FIG. 15A illustrates differences between heights a and b (b−a) of light emitting layers at measurement positions for Embodiment 1 of the display panel 10, and FIG. 15B illustrates differences between heights a and b (b−a) of red light emitting layers at measurement positions for Embodiment 2 of the display panel 10 and a reference example. FIG. 15A and FIG. 15B are diagrams normalized based on a maximum value obtained from the reference example. The average value of height differences (b−a) of light emitting layers is such that reference example>Embodiment 2>Embodiment 1, and as the amount of ink applied to the dummy gaps 522zA increases, the height differences (b−a) of light emitting layers formed in the gaps 522zR next to the dummy gaps 522zA decrease. Further, the same effect was observed for distribution (variance).

[Discussion]

From the measurement results of Embodiments 1 and 2 and the reference example, suppression of an increase in ink thickness in the peripheral portions of the pixel regions 10a1 can be confirmed, in the gaps 522zB, 522zR near the boundaries with the non-pixel regions 10a2, because of the presence of a large amount of ink of the dummy light emitting layers 123A applied to the dummy gaps 522zA. In the order of Embodiment 1>Embodiment 2>reference example, decreases in solvent vapor pressure in the peripheral portions relative to the central portions are suppressed, and this is thought to be due to the a decrease in difference in solvent evaporation rate in the gaps 522zB, 522zR between the outward ink portions and the inward ink portions.

Modifications

The display panel 10 pertaining to at least one embodiment has been described, but the present disclosure is not limited to the embodiments described above. For example, various modifications achievable by a person having ordinary skill in the art, and any combination of elements and functions of embodiments and modifications that do not depart from the spirit of the present invention are also included in the present disclosure. The following describes modifications of the display panel 10 as examples of such embodiments.

(Modification 1)

The following describes a display panel 10A pertaining to Modification 1.

FIGS. 17A, 17B, and 17C are schematic plan view diagrams of a same portion as portion A in FIG. 1, illustrating formation of light emitting layers of the display panel 10A pertaining to Modification 1.

According to the display panel 10, in the formation of the light emitting layers, the ink filling the dummy gaps 522zA may be an ink including organic light emitting layer material of any one of blue (B), green (G), or red (R) light emitting layers, and ink application into the dummy gaps 522zA is performed during inkjet head scanning applying the same color of ink to the pixel gaps 522zP.

In contrast, the display panel 10A pertaining to Modification 1 is different from the display panel 10, as illustrated in FIG. 17A, 17B, 17C, in that blue (B), green (G), and red (R) inks are each applied to each of the dummy gaps 522zA in inkjet head scanning applying ink to the pixel gaps 522zP. In this case, the display panel 10A has a structure in which each of the dummy light emitting layers 123A formed in the dummy gaps 522zA includes each of the blue (B), green (G), and red (R) organic light emitting materials. Thus, according to the display panel 10A, in every scan applying blue (B), green (G), or red (R) ink, ink can be applied to all of the dummy gaps 522zA and a subset of the pixel gaps 522zP.

Further, manufacture of the display panel 10A may be configured such that in a first inkjet head scan, ink is dropped to an overflow limit into the dummy gaps 522zA, and in a second inkjet scan, an amount of solvent decrease due to evaporation is calculated in advance and new ink is dropped in an amount that compensates for the solvent decrease. More specifically, when a scanning interval of the inkjet head is from 30 seconds to 1 minute, for example, it is desirable to adopt a configuration that supplements ink by an amount that compensates for 10% to 20% solvent evaporation from ink filling the dummy gaps 522zA in natural drying. Thus, according to the display panel 10A, in every scan applying blue (B), green (G), or red (R) ink, ink can be applied to all of the dummy gaps 522zA to fill to an overflow limit, and to a subset of the pixel gaps 522zP.

Thus, among the pixel gaps 522zP in the pixel regions 10a1, increases in ink film thickness of outward ink portions in the pixel regions 10a1 are further suppressed for the gaps 522zB, 522zR that are near the boundaries with the non-pixel regions 10a2.

(Modification 2)

The following describes a display panel 10B pertaining to Modification 2.

Figure 18:
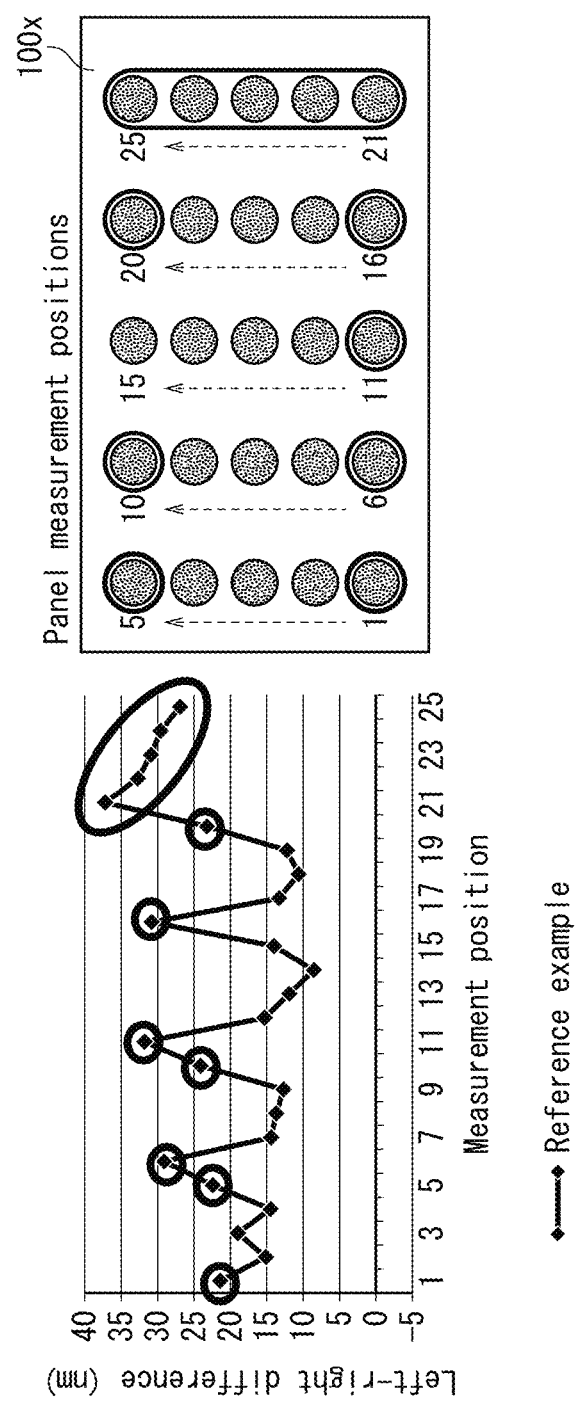
FIG. 18 is a diagram illustrating measurement positions and differences between heights a and b (b−a) of red light emitting layers at the measurement positions, with respect to a reference example, where measurement positions in a peripheral portion of a substrate 100x and measurement values at these measurement positions are circled.

FIG. 18 is a diagram illustrating measurement positions and differences between heights a and b (b−a) of red light emitting layers at the measurement positions with respect to a reference example, where measurement positions in a peripheral section of the substrate 100x and measurement values at these measurement positions are circled. As illustrated in FIG. 18, in the reference example, the circled height differences b−a of light emitting layers at the measurement positions in the peripheral section of the substrate 100x are larger than the height difference results for other measurement positions. That is, in the display panel 10X, among the pixel gaps 522zP in the pixel regions 10a1, ink film thickness increases are large in the gaps 522zB, 522zR near the boundaries with the non-pixel regions 10a2, towards the edges of the pixel regions 10a1. Here, "peripheral section"

refers to a range from an outer edge of the substrate 100x to positions approximately 3% towards a center of the substrate 100x, as illustrated in FIG. 18. Further, "central section" refers to a range inwards of the "peripheral section", i.e., a range starting from the positions approximately 3% inwards from the outer edge of the substrate 100x.

In contrast, the display panel 10B pertaining to Modification 2 is characterized in that amounts of ink filled into the dummy gaps 522zA when forming the light emitting layers is greater in the peripheral section than the central section of the substrate 100x.

Figure 19:
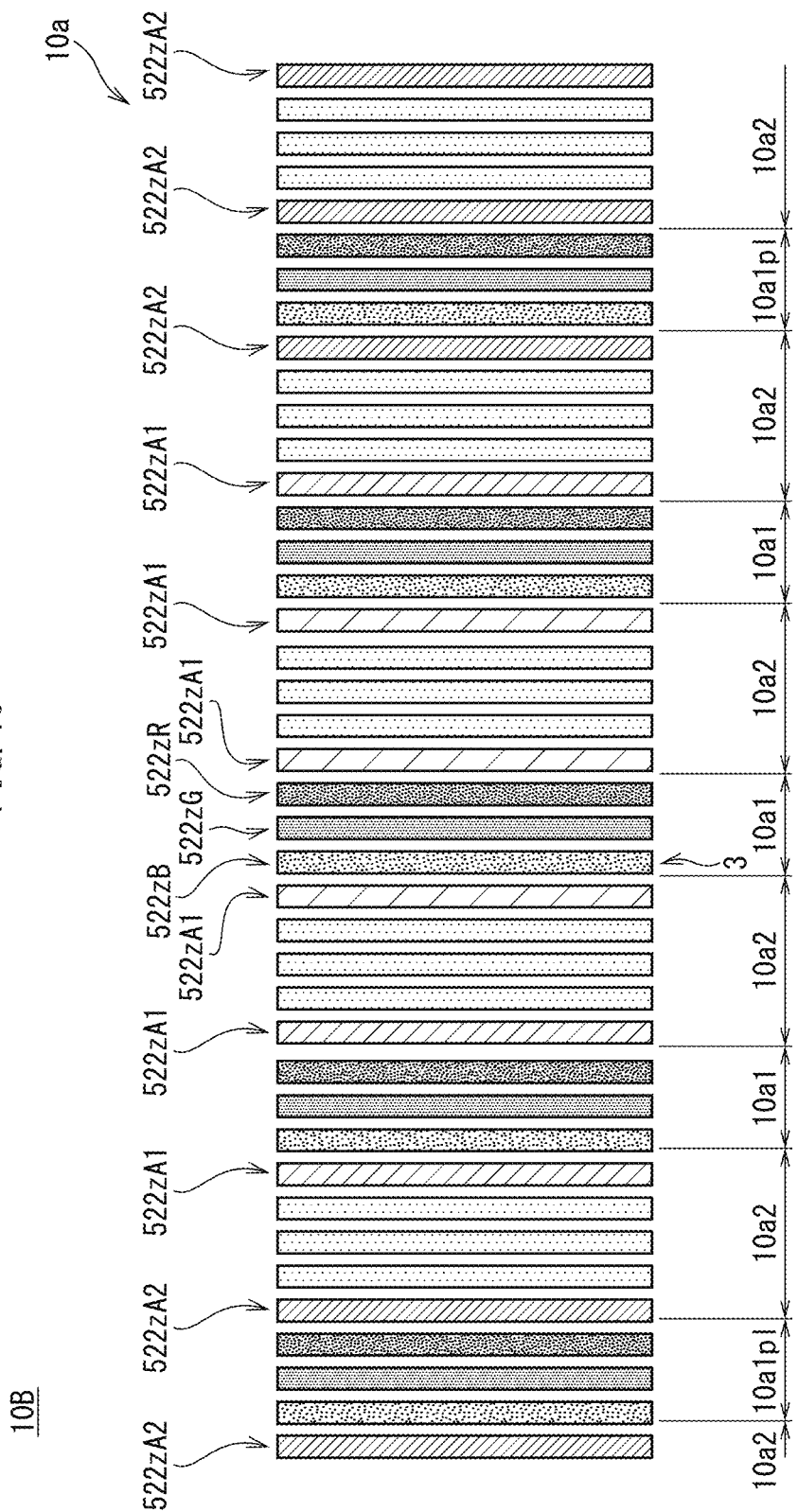
FIG. 19 is a schematic plan view diagram of a same portion as portion A in FIG. 1, illustrating an organic EL display panel 10B pertaining to Modification 2.

FIG. 19 is a schematic plan view diagram of a same portion as portion A in FIG. 1, illustrating the display panel 10B pertaining to Modification 2. As indicated in FIG. 19, during manufacture of the display panel 10B, amounts of ink filling dummy gaps 522zA2 in the peripheral section of the image display region 10a are greater than amounts of ink filling dummy gaps 522zA1 in the central section of the image display region 10a. Accordingly, in the display panel 10B, among the dummy light emitting layers 123A adjacent to the pixel columns 10e1, peripheral dummy light emitting layers 123A2 near edges of the substrate 100x in the row direction include more organic light emitting material than central dummy light emitting layers 123A1 nearer the center of the substrate 100x in the row direction.

As a result, in the peripheral section of the substrate 100x, it is possible to suppress the phenomenon of significant increases in ink film thicknesses among the pixel gaps 522zP in the pixel regions 10a1 near the boundaries with the non-pixel regions 10a2.

Further, in the process of forming the light emitting layers, amounts of ink droplets ejected from each nozzle of the inkjet head when applying ink to each of the dummy gaps 522zA2 may be controlled to vary in the column direction. That is, amounts of ink droplets ejected from each nozzle of the inkjet head may be controlled such that amounts of ink filling portions of the dummy gaps 522zA2 in the peripheral section of the image display region 10a in the column direction are greater than amounts of ink filling portions of the dummy gaps 522zA2 in the central section of the image display region 10a.

(Modification 3)

The following describes a display panel 10C pertaining to Modification 3.

Figure 20:
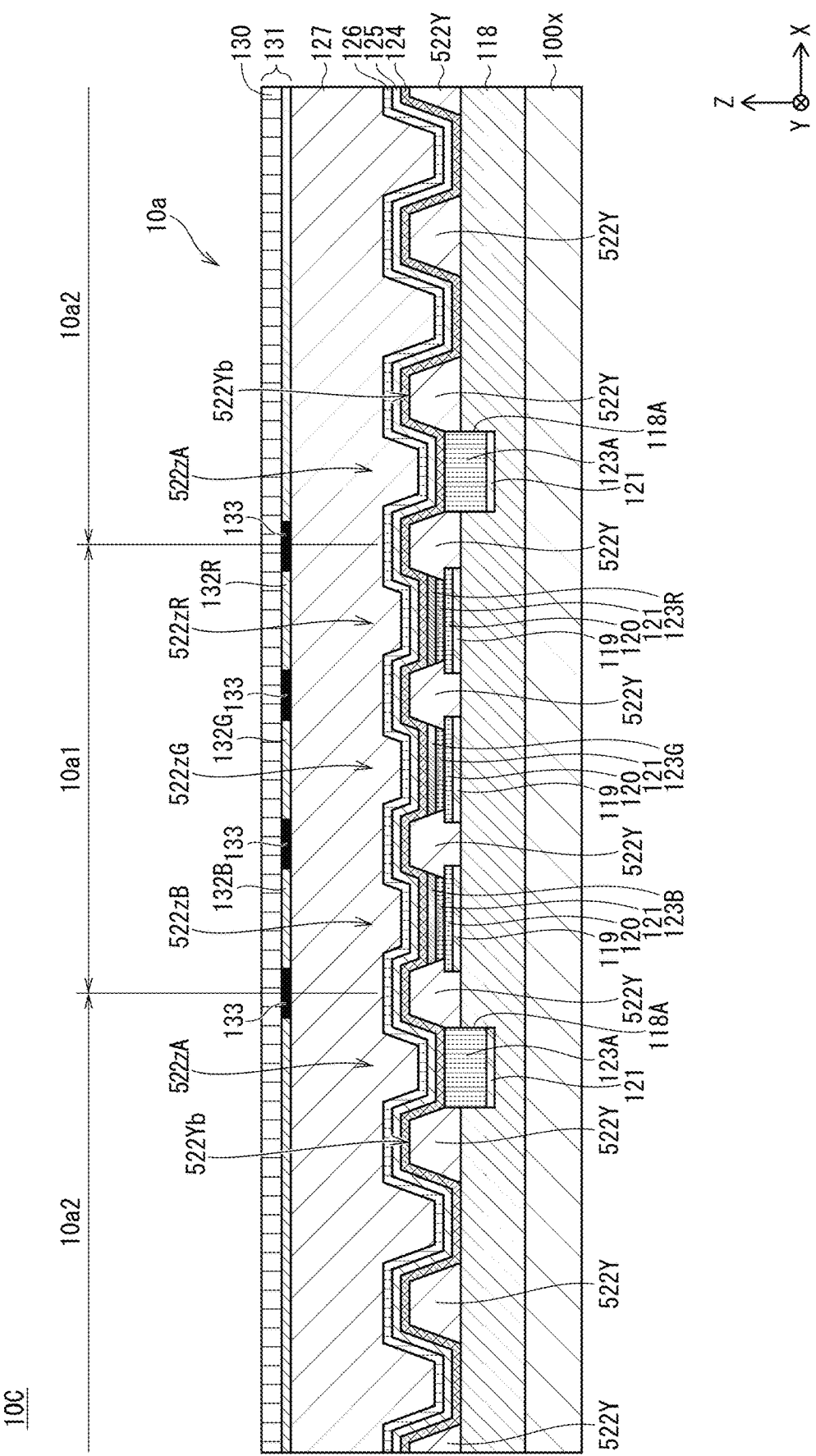
FIG. 20 is a schematic cross section diagram taken along a same position as X1-X1 in FIG. 2, illustrating an organic EL display panel 10C pertaining to Modification 3.

FIG. 20 is a schematic cross section diagram taken along a same position as X1-X1 in FIG. 2, illustrating the display panel 10C pertaining to Modification 3. In the display panel 10C pertaining to Modification 3, as illustrated in FIG. 20, a structure is adopted in which recessed portions 118A are provided in the planarizing layer 118, making amounts of ink that can be held in the dummy gaps 522zA greater than amounts of ink that can be held in the pixel gaps 522zP. According to this structure, in the display panel 10C, the dummy light emitting layers 123A are thicker by an amount equivalent to a depth of the recessed portions 118A.

Further, in order to realize the structure pertaining to Modification 2, the dummy gaps 522zA in the peripheral section of the image display region 10a may be provided with the recessed portions 118A in the planarizing layer 118 to increase the thicknesses of the dummy light emitting layers 123A by the depth of the recessed portions 118A in the peripheral section of the image display region 10a. Thus, the structure pertaining to Modification 2 can be realized without changing widths of the dummy light emitting layers 123A in plan view, by increasing amounts of ink filling the dummy gaps 522zA in the peripheral section relative to the central section.

(Modification 4)

The following describes a display panel 10D pertaining to Modification 4.

Figure 21:
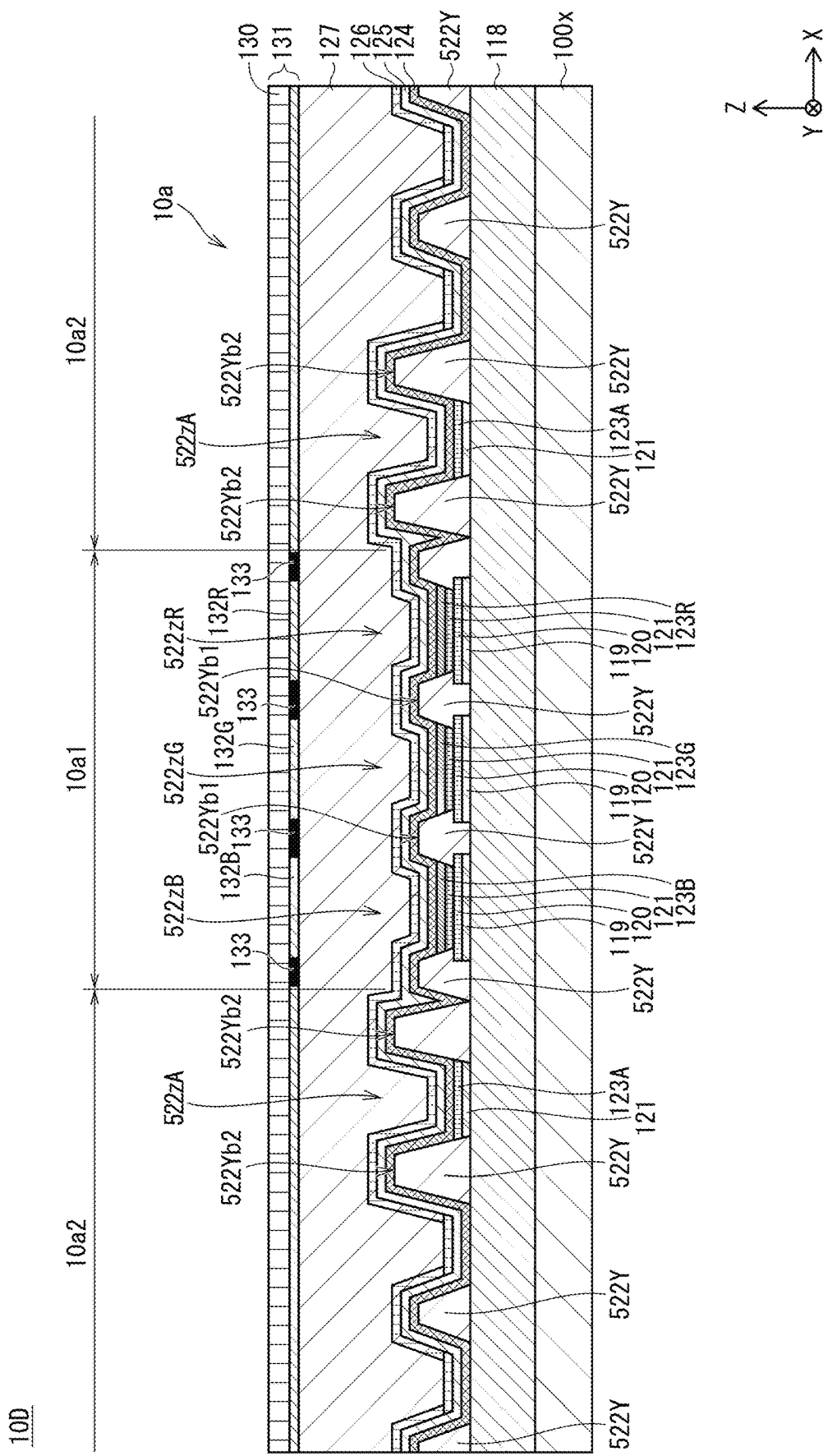
FIG. 21 is a schematic cross section diagram taken along a same position as X1-X1 in FIG. 2, illustrating an organic EL display panel 10D pertaining to Modification 4.

FIG. 21 is a schematic cross section diagram taken along a same position as X1-X1 in FIG. 2, illustrating the display panel 10D pertaining to Modification 4. In the display panel 10D pertaining to Modification 4, as illustrated in FIG. 21, a structure is adopted in which amounts of ink held in the dummy gaps 522zA is greater than amounts of ink held in the pixel gaps 522zP by making tops 522Yb2 of the column banks 522Y on both sides of the dummy gaps 522zA higher than tops 522Yb1 of the column banks 522Y on both sides of the pixel gaps 522z. According to this structure, in the display panel 10D, thicknesses of the dummy light emitting layers 123A are increased by the increase in height of the column banks 522Y.

Further, in order to realize the structure pertaining to Modification 2, the dummy light emitting layers 123A may be increased in thickness by an increase in the peripheral section of the image display region 10a of heights of the tops 522Yb2 of the column banks 522Y on both sides of the dummy gaps 522zA relative to the tops 522Yb1 of the column banks 522Y on both sides of the pixel gaps 522z. Thus, the structure pertaining to Modification 2 can be realized without changing widths of the dummy light emitting layers 123A in plan view.

(Modification 5)

The following describes a display panel 10E pertaining to Modification 5.

The display panel 10E pertaining to Modification 5 is characterized in that amounts of ink filled into the dummy gaps 522zA when forming the light emitting layers is greater in the peripheral section than the central section of the substrate 100x, as is also true for Modification 2.

Figure 22:
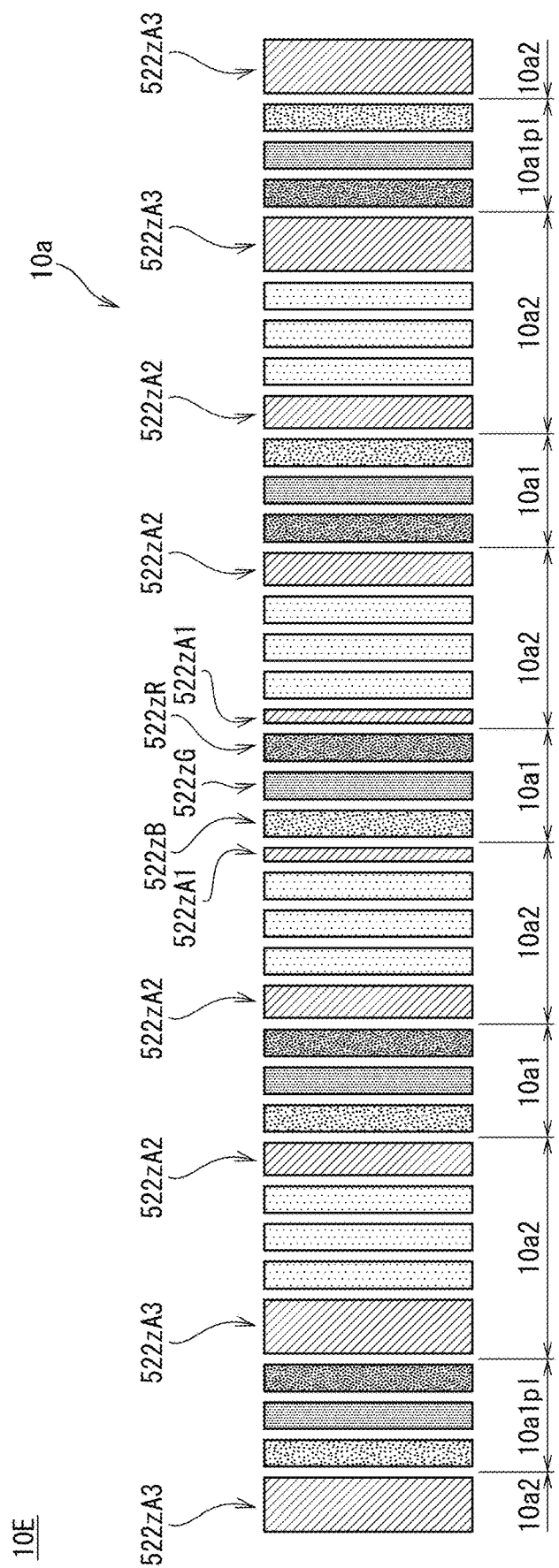
FIG. 22 is a schematic plan view diagram of a same portion as portion A in FIG. 1, illustrating an organic EL display panel 10E pertaining to Modification 5.

FIG. 22 is a schematic plan view diagram of a same portion as portion A in FIG. 1, illustrating the display panel 10E pertaining to Modification 5. In the display panel 10E, as illustrated in FIG. 22, a structure is adopted such that width in the row direction of dummy gaps 522zA1, 522zA2, 522zA3 increases in this order from the central section to the peripheral section of the image display region 10a, so that amounts of ink filling the dummy gaps 522zA1, 522zA2, 522zA3 increases in steps from the central section to the peripheral section. As a result, in the display panel 10E, width of the dummy light emitting layers 123A in the image display region 10a increases in steps from the central section to the peripheral section.

As a result, in the peripheral section of the substrate 100x, it is possible to suppress the phenomenon of stepped increases in ink film thicknesses among the pixel gaps 522zP in the pixel regions 10a1 near the boundaries with the non-pixel regions 10a2.

(Modification 6)

The following describes a method of manufacturing a display panel pertaining to Modification 6.

When an evaporation rate of a solvent and solid solute undergoing natural drying is Vp ($\mu m^3/s$), pixel surface area is S ($\mu m^2$), number of drops is d, and ink volume per drop is ρ ($\mu m^3$), then solvent evaporation time per unit area A (s/$\mu m^2$) is calculated by the following equation:

[Math 1]

$$A = d \cdot \rho / S \cdot Vp \quad \text{(Equation 1)}$$

Here, the evaporation rate of the solvent Vp is calculated by printing various inks on a liquid repellant substrate, observing how ink droplets shrink by using a camera, and obtaining a surface area of ink that evaporates per unit time.

According to the method of manufacturing the display panel pertaining to Modification 6, when forming the light emitting layers, an ink among the inks emitting blue (B), green (G), and red (R) light for which the solvent evaporation time per unit area A is large is printed first.

According to the inventor's study, the shorter the solvent evaporation time per unit area A, the greater the increase in ink film thicknesses in the outward ink portions of the pixel regions 10a1 in the pixel gaps 522zP near the boundaries of the non-pixel regions 10a2. Thus, an ink with a large solvent evaporation time per unit area A is printed first, and an ink with a short solvent evaporation time per unit area A is printed subsequently, so that the ink with a short solvent evaporation time per unit area A is applied in an environment with a high solvent vapor pressure, which can suppress drying. As a result, it is possible to suppress the phenomenon of increases in ink film thicknesses of outward ink portions in the pixel regions for ink having a short solvent evaporation time per unit area A.

(Modification 7)

The following describes a method of manufacturing a display panel pertaining to Modification 7.

In the method of manufacturing the display panel pertaining to at least one embodiment, inks containing organic light emitting materials are applied to the pixel gaps 522zP in which the sub-pixel electrodes 119 are present and at least to the non-pixel gaps 522zA adjacent to the pixel gaps 522zP in the row direction, in which the sub-pixel electrodes 119 are not present. However, according to the method of manufacturing the display panel pertaining to Modification 7, inks containing organic light emitting materials are applied to the pixel gaps 522zP in which the sub-pixel electrodes 119 are present, but in at least the non-pixel gaps 522zA adjacent to the pixel gaps 522zP in the row direction, in which the sub-pixel electrodes 119 are not present, a dummy solvent is applied.

According to this method, as in the display panel 10 pertaining to at least one embodiment, it is possible to suppress occurrence of uneven film thicknesses of the light emitting layers 123 in application regions on the substrate, thereby suppressing the occurrence of uneven brightness. In addition, in the display panel pertaining to Modification 7, organic light emitting material does not remain after drying of the dummy solvent applied to the non-pixel gaps 522zA, and therefore in the completed display panel, visible light transmission can be improved in the non-pixel gaps 522zA adjacent to the pixel gaps 522zP, and visibility of a transmitted image can be improved for a light transmissive display panel.

(Modification 8)

The following describes a display panel 10F pertaining to Modification 8.

Figure 23:
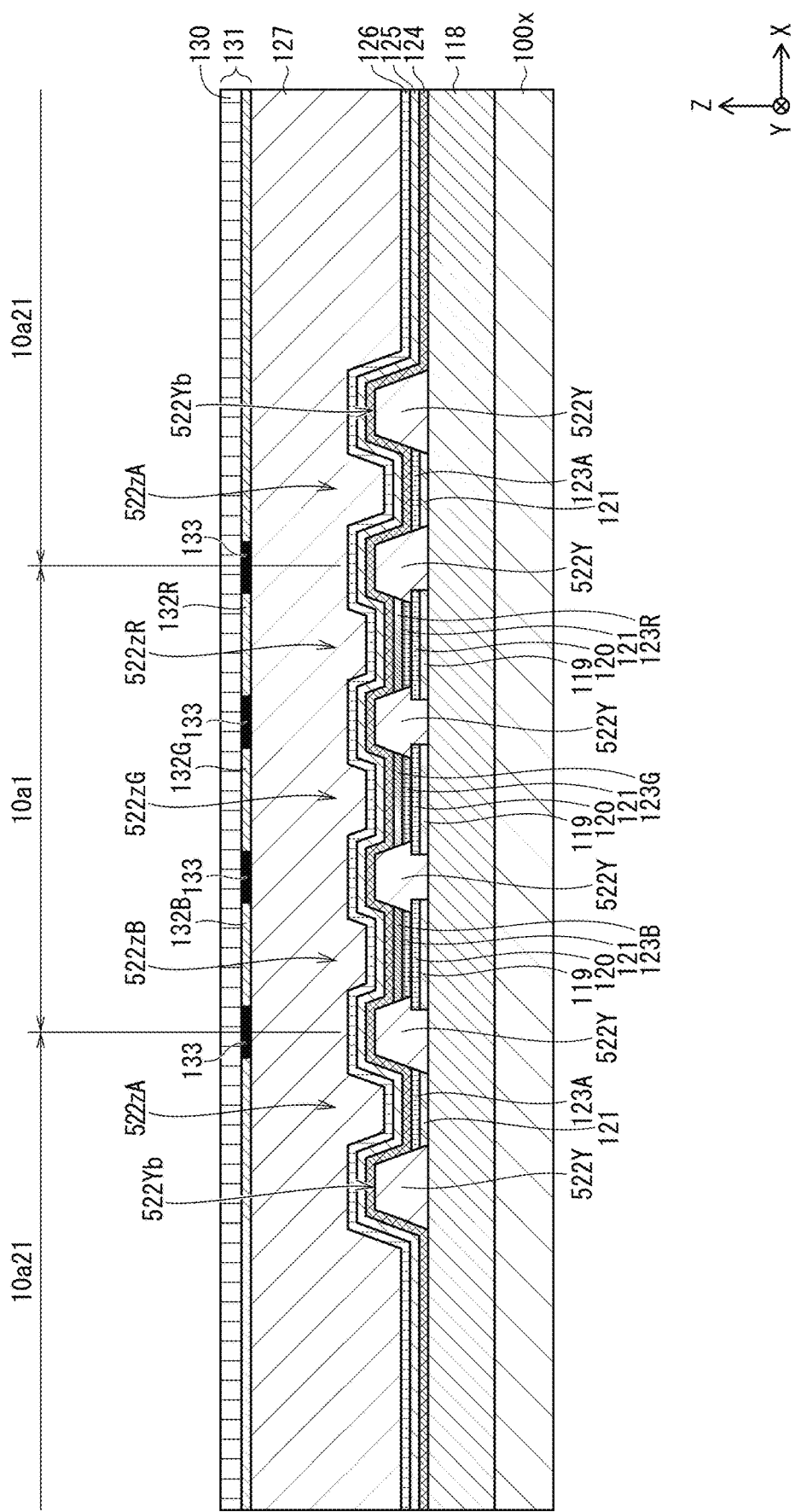
FIG. 23 is a schematic cross section diagram taken along a same position as X1-X1 in FIG. 2, illustrating an organic EL display panel 10F pertaining to Modification 8.
Figure 24:
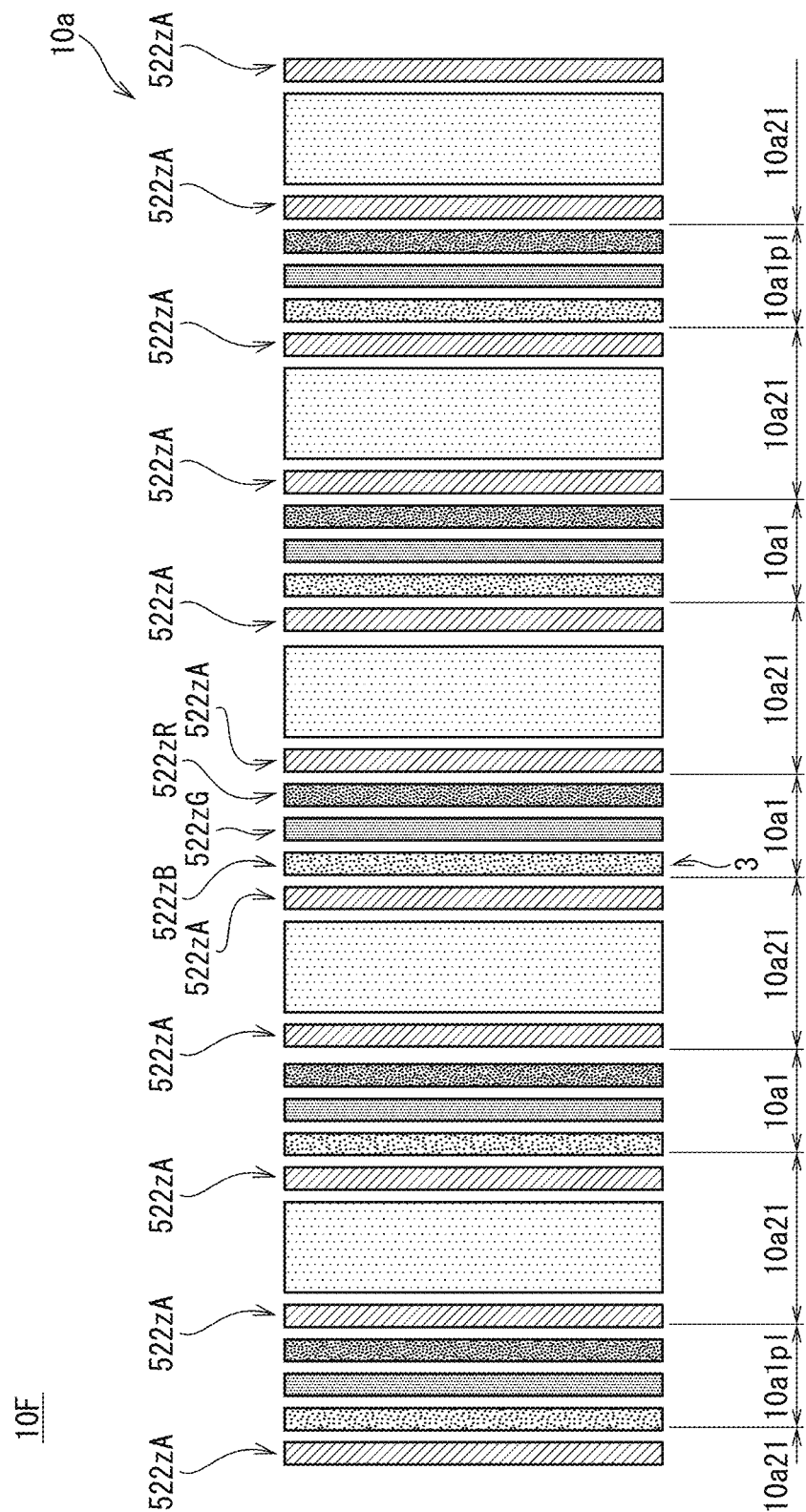
FIG. 24 is a schematic plan view diagram of a same portion as portion A in FIG. 1, illustrating the organic EL display panel 10F pertaining to Modification 8.

FIG. 23 is a schematic cross section diagram taken along a same position as X1-X1 in FIG. 2, illustrating an organic EL display panel 10F pertaining to Modification 8. FIG. 24 is a schematic plan view diagram of a same portion as portion A in FIG. 1, illustrating the organic EL display panel 10F pertaining to Modification 8.

According to the display panel 10F pertaining to Modification 8, as illustrated in FIG. 23, no column banks are present in non-pixel regions 10a21 other than the column banks 522Y adjacent to the dummy gaps 522zA. More specifically, in the pixel columns 100e1, the column banks 522Y extend in the column direction on the top surface of the substrate 100x, the pixel electrodes 119 that correspond one-to-one with the organic EL elements 100 and the light emitting layers 123 each including one of the organic light emitting materials are disposed in the pixel gaps 522zP between the column banks 522Y, and only column banks that are adjacent to the outermost column banks 522Y in the row direction that define the pixel gaps 522zP and together with the outermost column banks 522Y define the dummy gaps 522zA are disposed in the non-pixel regions 10a21. The dummy light emitting layers 123A are disposed in the dummy gaps 522zA. Otherwise the structure is the same as that of the display panel 10A pertaining to at least one embodiment.

According to this structure, the display panel 10F has improved visibility of an object on the back side of the display panel (background object).

(Modifications 9, 10)

The following describes a display panel 10G pertaining to Modification 9 and a display panel 10H pertaining to Modification 10.

Figure 25:
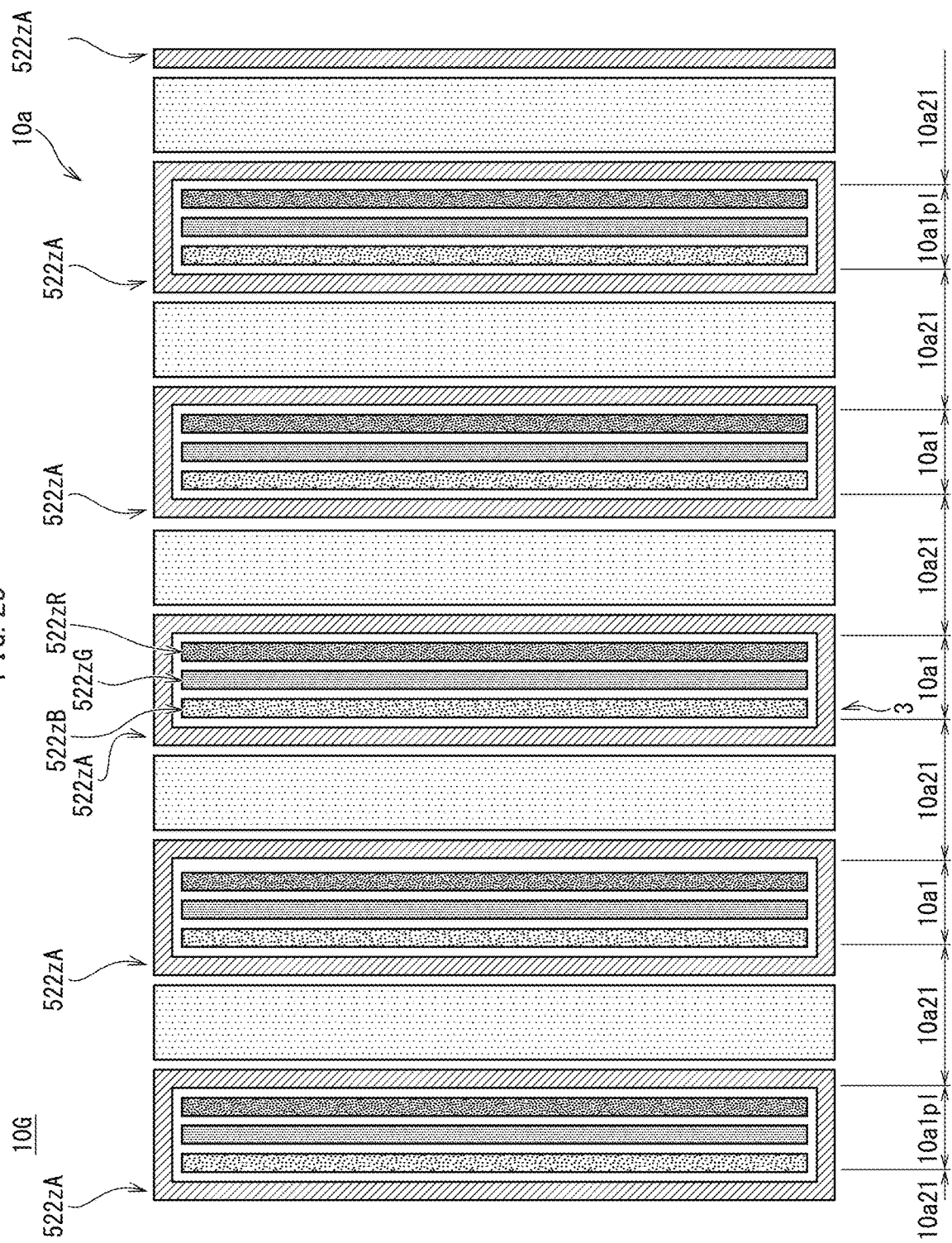
FIG. 25 is a schematic plan view diagram illustrating an organic EL display panel 10G pertaining to Modification 9.
Figure 26:
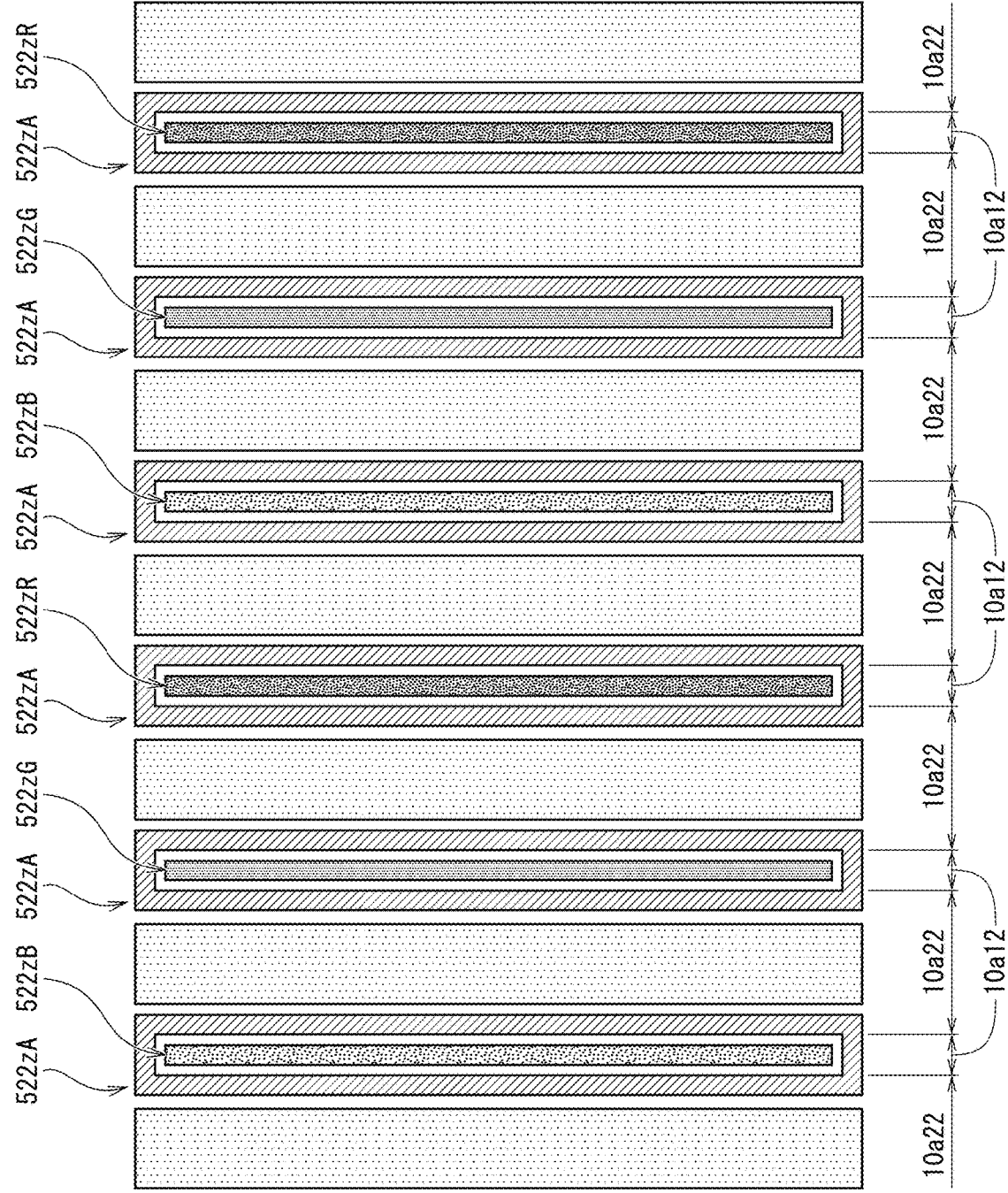
FIG. 26 is a schematic plan view diagram illustrating an organic EL display panel 10H pertaining to Modification 10.

FIG. 25 is a schematic plan view diagram illustrating the display panel 10G pertaining to Modification 9. FIG. 26 is a schematic plan view diagram illustrating the display panel 10H pertaining to Modification 10.

In the display panels 10G, 10H pertaining to Modifications 9, 10, as illustrated in FIG. 25, FIG. 26, column banks are not present in the non-pixel regions 10a21 other than the column banks 522Y adjacent to the dummy gaps 522zA, as in the display panel 10F pertaining to Modification 8.

Further, in the display panel 10G pertaining to Modification 9, as illustrated in FIG. 25, with respect to the gaps 522zB, 522zG, 522zR of each of the pixel regions 10a1, the dummy gaps 522zA to the left of the gaps 522zB and to the right of the gaps 522zR in the row direction are connected to each other at ends of the dummy gaps 522zA in the Y direction of the pixel regions 10a1. That is, the gaps 522zP are surrounded by the dummy gaps 522zA in which the dummy light emitting layers 123A are present.

According to this structure, in the display panel 10G, it is possible to suppress a phenomenon of inks of the light emitting layers 123 applied to the pixel gaps 522zP in the pixel regions 10a1 on the substrate 100x having a relatively high solvent evaporation rate in peripheral portions in the column direction of the pixel regions 10a1 and therefore starting to dry from the peripheral portions in the column direction. As a result, it is possible to suppress occurrence of light emitting layer film thickness imbalance in the gaps 522zP in the column direction in sub-pixels in peripheral portions in the column direction of the pixel regions 10a1, and a decrease in brightness of sub-pixels due to a failure to achieve an average film thickness required for sub-pixels. In particular, it is possible to suppress a large variation in luminance in peripheral portions in the column direction of the pixel regions 10a1 when the display panel 10G is viewed from an oblique direction.

According to the display panel 10H pertaining to Modification 10, as illustrated in FIG. 26, the gaps 522zB, 522zG, 522zR are arranged separated from each other by a defined distance in the row direction, and between the gaps 522zB, 522zG, 522zR are non-pixel regions 10a22 having a defined width. According to this structure, the display panel 10H has improved visibility of an object on the back side of the display panel (background object).

With respect to each of the gaps 522zB, 522zG, 522zR in each of pixel regions 10a12, the dummy gaps 522zA on both sides of the gaps 522z in the row direction are connected to each other at ends of the dummy gaps 522zA in the Y direction of the pixel regions 10a12. In other words, each of the gaps 522zB, 522zB, 522zR is surrounded by a linked pair of the dummy gaps 522zA in which the dummy light emitting layers 123A are present. According to this structure, it is possible to suppress a large variation in luminance in peripheral portions in the column direction of the pixel regions 10a12 when the display panel 10H is viewed from an oblique direction.

Circuit Structure

Figure 27:
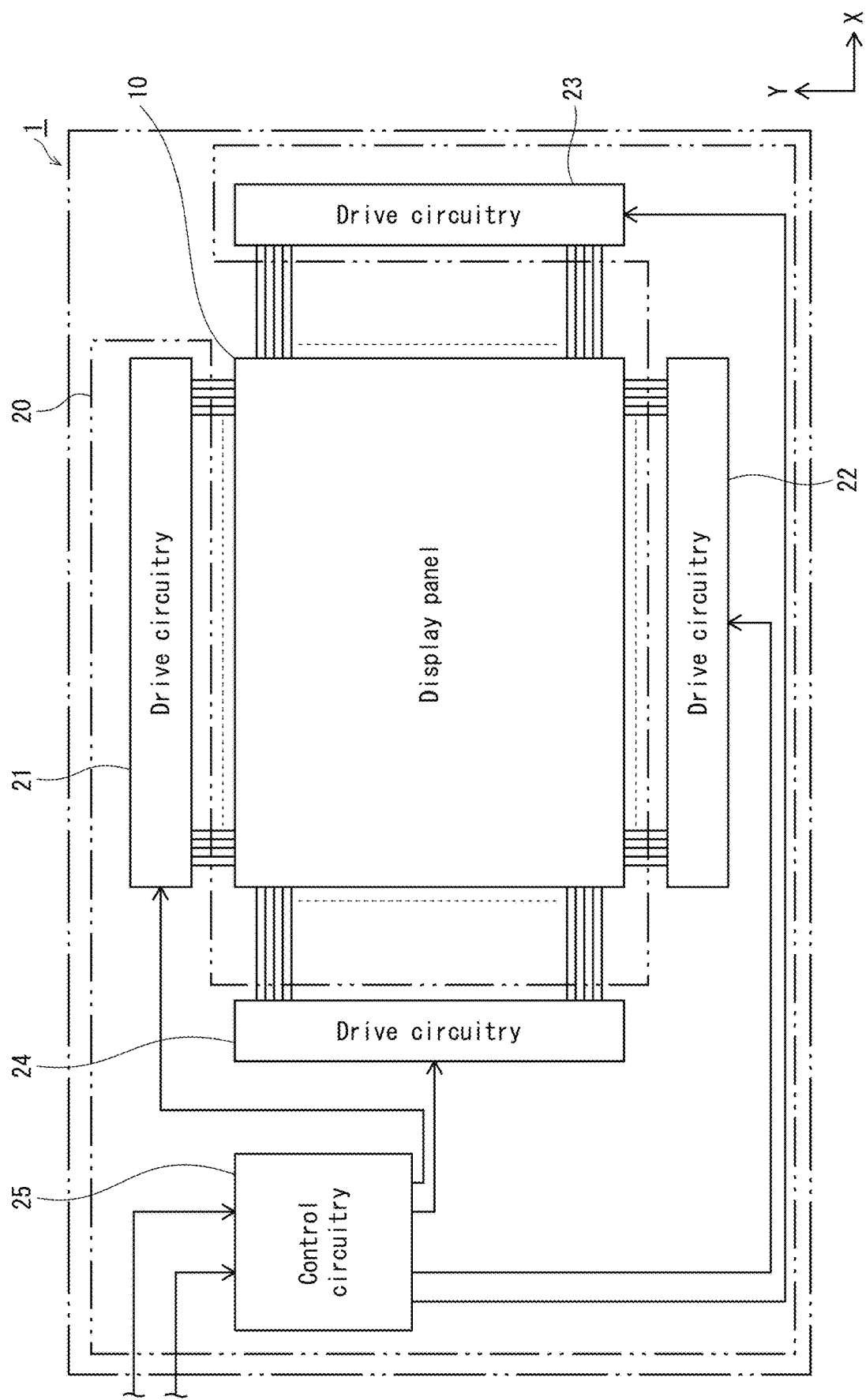
FIG. 27 is a schematic block diagram illustrating circuit structure of an organic EL display device according to at least one embodiment.

The following describes circuit structure of the organic EL display device 1 pertaining to at least one embodiment. As illustrated in FIG. 27, the organic EL display device includes the display panel 10 and drive control circuitry 20 connected to the display panel 10. The drive control circuitry 20 includes four drive circuits 21, 22, 23, 24 and a control circuit 25.

Figure 28:
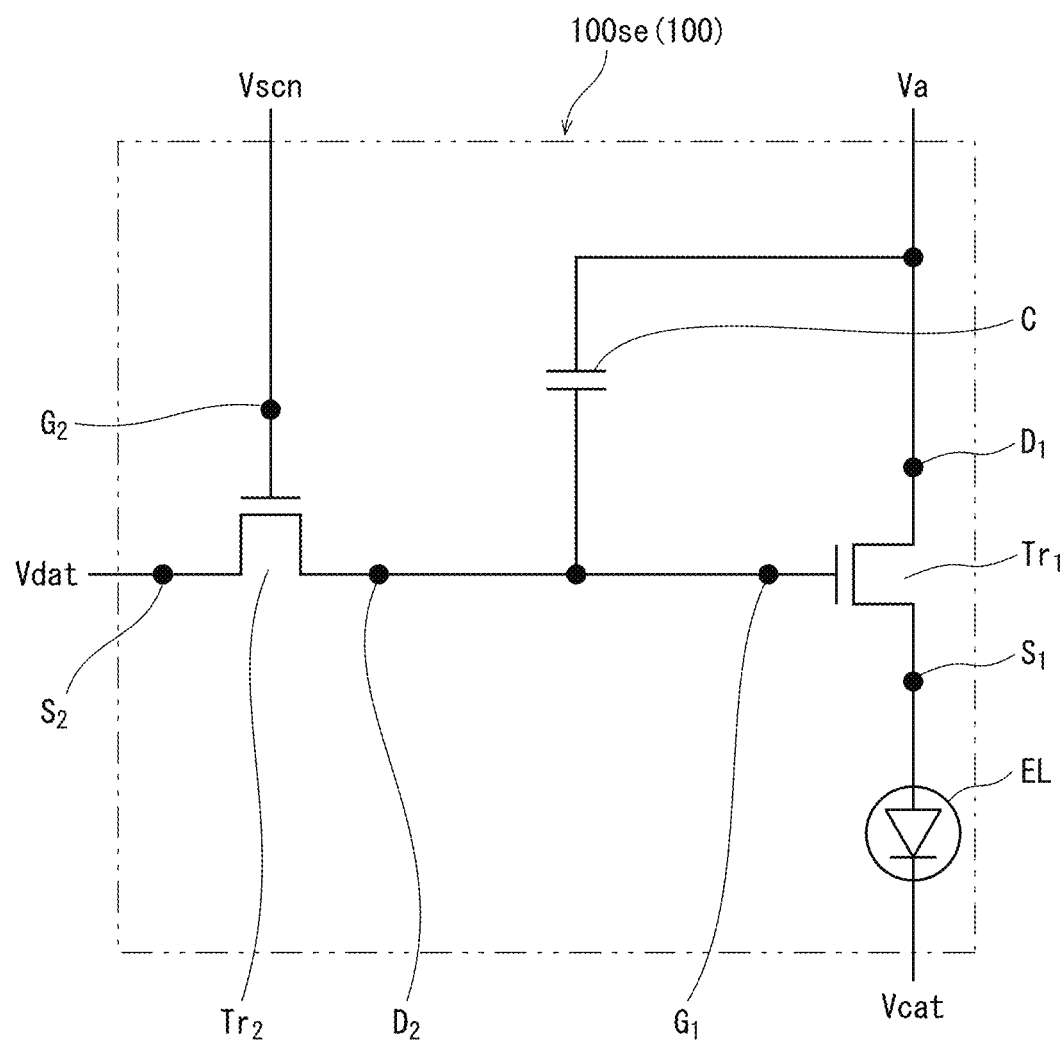
FIG. 28 is a schematic circuit diagram illustrating circuit structure of a sub-pixel 100se of the organic EL display panel 10 used in an organic EL display device according to at least one embodiment.

In the display panel 10, the pixels 100e are arranged in a matrix, forming a display region. Each of the pixels 100e includes three organic EL elements 100 of different colors, or in other words three of the sub-pixels 100se emitting blue (B), green (G), and red (R) light, respectively. Circuit structure of each of the sub-pixels 100se is described below. FIG. 28 is a schematic circuit diagram illustrating circuit structure in each of the organic EL elements 100 corresponding to the sub-pixels 100se of the display panel 10. According to the display panel 10 pertaining to at least one embodiment, each of the sub-pixels 100se includes two transistors $Tr_1$, $Tr_2$, one capacitor C, and an organic EL element portion EL as a light emitter. The transistor $Tr_1$ is a drive transistor and the transistor $Tr_2$ is a switching transistor.

A gate $G_2$ of the switching transistor $Tr_2$ is connected to a scan line Vscn, and a source $S_2$ is connected to a data line Vdat. A drain $D_2$ of the switching transistor $Tr_2$ is connected to a gate $G_1$ of the drive transistor $Tr_1$.

A drain $D_1$ of the drive transistor $Tr_1$ is connected to a power source line Va, and a source $S_1$ is connected to a pixel electrode (anode) of the organic EL element portion EL. A counter electrode (cathode) of the organic EL element portion EL is connected to a ground line Vcat.

A first end of the capacitor C is connected to the drain $D_2$ of the switching transistor $Tr_2$ and the gate $G_1$ of the drive transistor $Tr_1$, and a second end of the capacitor C is connected to the power source line Va.

In the display panel 10, for each of the sub-pixels 100se, a gate line leads out from the gate $G_2$ and is connected to the scan line Vscn connecting from outside the display panel 10. Similarly, for each of the sub-pixels 100se, a source line leads out from the source $S_2$ and is connected to the data line Vdat connected from outside the display panel 10.

Further, power source lines Va and ground lines Vcat of the sub-pixels 100se are aggregated and connected to a power source line and a ground line of the organic EL display device 1.

Review

As described above, the organic EL display panel pertaining to at least one embodiment is the light-transmissive display panel 10 including: the light transmissive substrate 100x; the organic EL elements 100 on the substrate 100x, where the pixels 100e each including a plurality of the organic EL elements 100 arranged along a row direction are arranged in the pixel columns 100e1 each including a plurality of the pixels 100e arranged along a column direction, the pixel columns 100e1 are arranged in parallel along the row direction, and intervals between the pixel columns 100e1 are each greater than a width in the row direction of any of the pixel columns 100e1; and the dummy light emitting layers 123A, wherein each of the organic EL elements 100 included in one of the pixels 100e includes any one of a plurality of organic light emitting materials that emit different colors of light, and when each portion of the substrate 100x corresponding to one of the intervals is defined as a non-pixel region 10a2 of the substrate, the dummy light emitting layers 123A include any one of the plurality of organic light emitting materials and are present above portions of the non-pixel regions 10a2 adjacent to the pixel columns 100e1 in the row direction.

Further, a method of manufacturing a light-transmissive organic EL display panel pertaining to at least one embodiment of the present disclosure includes: preparing the substrate 100x; above the substrate 100x, arranging columns of the sub-pixel electrodes 119 in each of which a plurality of the sub-pixel electrodes 119 are arranged along a column direction into sub-pixel electrode column groups of parallel sub-pixel electrode columns separated from each other by first gaps in the row direction, and arranging the sub-pixel electrode column groups parallel to each other and separated from each other by second gaps in the row direction wider than the first gaps in the row direction; forming the column banks 522Y that extend in the column direction, so as to sandwich each of the sub-pixel electrode columns in the row direction on portions of a top surface of the substrate 100x where the sub-pixel electrode column groups are present, and at a pitch of the sub-pixel electrodes 119 in the row direction on portions of the top surface of the substrate 100x corresponding to the second gaps; applying ink including organic light emitting material to, among gaps between the column banks, the pixel gaps 522zP where the sub-pixel electrodes 119 are present and, among the non-pixel gaps 522zA where the sub-pixel electrodes 119 are not present, at least non-pixel gaps 522zA adjacent to the pixel gaps 522zP in the row direction; evaporating a solvent included in the ink to form the light emitting layers 123 in the pixel gaps 522zP and the dummy light emitting layers 123A in the non-pixel gaps 522zA adjacent to the pixel gaps 522zP in the row direction; and forming the counter electrode 125 above the light emitting layers 123.

According to this structure, it is possible to suppress occurrence of uneven film thickness in light emitting layers in application regions of a substrate of a light transmissive organic EL display panel.

Accordingly, large brightness differences can be suppressed if they depend on the direction and extent of sub-pixel imbalance when viewed from an oblique angle when a mix of sub-pixels have thicknesses that are unbalanced to different extents and in different directions.

As a result, visibility from an oblique angle can be improved. Thus, the invention can be effectively used as a light transmissive display panel that requires higher visibility when viewed from an oblique angle than a reflective display panel because viewing angle of a display image varies due to the influence of a positional relationship between the viewer and a background object.

Other Modifications

In the display panel 10 pertaining to at least one embodiment, the light emitting layers 123 extend continuously in the column direction over row banks. However, the light emitting layers 123 may be discontinuous and separated per pixel by the row banks.

Further, in the display panel 10, the colors of light emitted by the light emitting layers 123 of the sub-pixels 100se in the gaps 522z between the column banks 522Y that are adjacent in the row direction are different from each other, and the colors of light emitted by the light emitting layers 123 of the sub-pixels 100se that are adjacent in the column direction are the same. However, the colors of light emitted by the light emitting layers 123 of the sub-pixels 100se that are adjacent in the row direction may be the same, and the colors of light emitted by the light emitting layers 123 of the sub-pixels 100se that are adjacent in the column direction may be different from each other. Further, the colors may be different from each other for light emitted by the light emitting layers 123 of the sub-pixels 100se that are adjacent in the column and row directions.

According to the display panel 10 pertaining to at least one embodiment, each of the pixels 100e includes a red pixel, a green pixel, and a blue pixel, but the present invention is not limited to this example. As another example, the light emitting layers may all be of a single type, or there may be four types emitting colors of light such as red, green, blue, and yellow.

Further, according to at least one embodiment, the hole injection layers 120, the hole transport layers 121, the light emitting layers 123, and the electron transport layer 124 are present between the pixel electrodes 119 and the counter electrode 125, but the present invention is not limited to this structure. For example, a structure is possible in which only the light emitting layers 123 are present between the pixel electrodes 119 and the counter electrode 125, without using the hole injection layers 120, the hole transport layers 121, and the electron transport layer 124. Further, for example, a structure is possible in which a layer or a plurality of layers selected from the group consisting of hole injection layers, hole transport layers, an electron transport layer, and an electron injection layer are present. Further, all these layers need not be made of organic compounds, and at least one layer may be made of an inorganic compound.

Further, according to at least one embodiment, a structure is adopted in which two transistors $Tr_1$, $Tr_2$ are provided for each of the sub-pixels 100se, but the present invention is not limited to this. For example, a structure may be adopted in which a single transistor or three or more transistors correspond to one sub-pixel.

Further, according to at least one embodiment, a top-emission type of EL display panel is given as an example, but the present invention is not limited to this. For example, a bottom-emission type of the display panel or the like can be used. In such a case, each structure can be changed appropriately. Further, the invention can be applied to a quantum dot display device using colloidal quantum dots.

Supplement

The embodiments described above each indicate one beneficial specific example of the present invention. Numerical values, shapes, materials, constituent elements, arrangement positions and connections of constituent elements, steps, order of steps, and the like indicated as embodiments are merely examples and are not intended to limit the present invention. Further, among constituent elements in the embodiments, any elements not described in independent claims representing top level concepts of the present invention are described as constituent elements constituting a more beneficial embodiment.

Further, the order described above in which steps are executed is for illustrative purposes, and the steps may be in an order other than described above. Further, a portion of the steps described above may be executed simultaneously (in parallel) with another step.

Further, in order to facilitate understanding of the invention, constituent elements in each drawing referenced by description of an embodiment are not necessarily drawn to scale. Further, the present invention is not limited to the description of the embodiments, and can be appropriately changed without departing from the scope of the present invention.

Further, at least a portion of functions of each embodiment and each modification may be combined.

Further, the present invention includes various modifications of the embodiments that are within the scope of ideas conceivable by a person skilled in the art.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

What is claimed is:

1. A light transmissive organic electroluminescence (EL) display panel comprising:
    a light transmissive substrate;
    organic EL elements on the substrate, where pixels each including a plurality of the organic EL elements arranged along a row direction are arranged in pixel columns each including a plurality of the pixels arranged along a column direction, the pixel columns are arranged in parallel along the row direction, and intervals between the pixel columns are each greater than a width in the row direction of any of the pixel columns; and
    dummy light emitting layers, wherein
    each of the organic EL elements included in one of the pixels includes any one of a plurality of organic light emitting materials that emit different colors of light, and
    when each portion of the substrate corresponding to one of the intervals is defined as a non-pixel region of the substrate, the dummy light emitting layers include any one of the plurality of organic light emitting materials and are present above portions of the non-pixel regions adjacent to the pixel columns in the row direction, wherein
    in the non-pixel regions, the portions where the dummy light emitting layers are present have a lower visible light transmittance in a thickness direction of the substrate than portions where the dummy light emitting layers are not present.

2. The organic EL display panel of claim 1, wherein the dummy light emitting layers include each of the plurality of the organic light emitting materials included in any one of the pixels.

3. The organic EL display panel of claim 1, wherein among the dummy light emitting layers adjacent to the pixel columns,
    peripheral dummy light emitting layers near edges of the substrate in the row direction contain more organic light emitting material than central dummy light emitting layers near a center of the substrate in the row direction.

4. The organic EL display panel of claim 3, wherein
the peripheral dummy light emitting layers are wider in the row direction than the central dummy light emitting layers.

5. The organic EL display panel of claim 3, wherein
the peripheral dummy light emitting layers have a greater film thickness than the central dummy light emitting layers.

6. The organic EL display panel of claim 1, wherein
the substrate includes a base and a planarizing layer made of an organic material formed on a top surface of the base, and
the dummy light emitting layers are present in grooves that are recesses in the planarizing layer.

7. The organic EL display panel of claim 1, further comprising column banks that extend in the column direction on the top surface of the substrate, wherein
the column banks define pixel gaps between the column banks in the pixel columns,
the organic EL elements in the pixel gaps each include a sub-pixel electrode and a portion of a light emitting layer,
the organic light emitting materials of the organic EL elements are in the light emitting layers, and
in the non-pixel regions, among non-pixel gaps between the column banks, the dummy light emitting layers are present in dummy pixel gaps nearest the pixel columns in the row direction.

8. The organic EL display panel of claim 7, wherein
among the column banks, column banks sandwiching the dummy pixel gaps are higher than column banks sandwiched by the pixel gaps.

9. The organic EL display panel of claim 1, further comprising column banks that extend in the column direction on the top surface of the substrate, wherein
the column banks define pixel gaps between the column banks in the pixel columns,
the organic EL elements in the pixel gaps each include a sub-pixel electrode and a portion of a light emitting layer,
the organic light emitting materials of the organic EL elements are in the light emitting layers, and
among the column banks, first column banks are disposed outermost in the pixel columns in the row direction, second column banks are the only column banks in the non-pixel regions, the first column banks and the second column banks sandwich dummy gaps, and the dummy light emitting layers are present in the dummy gaps.

10. The organic EL display panel of claim 1, wherein
two of the dummy light emitting layers adjacent to one of the pixel columns are connected to each other in the row direction by end portions of the two of the dummy light emitting layers in the column direction.

11. A method of manufacturing a light transmissive organic electroluminescence (EL) display panel, the method comprising:
preparing a substrate;
above the substrate, arranging columns of sub-pixel electrodes in each of which a plurality of sub-pixel electrodes are arranged along a column direction into sub-pixel electrode column groups of parallel sub-pixel electrode columns separated from each other by first gaps in the row direction, and arranging the sub-pixel electrode column groups parallel to each other and separated from each other by second gaps in the row direction wider than the first gaps in the row direction;
forming column banks that extend in the column direction, so as to sandwich each of the sub-pixel electrode columns in the row direction on portions of a top surface of the substrate where the sub-pixel electrode column groups are present, and at a pitch of the sub-pixel electrodes in the row direction on portions of the top surface of the substrate corresponding to the second gaps;
applying ink including organic light emitting material to, among gaps between the column banks, pixel gaps where the sub-pixel electrodes are present and, among non-pixel gaps where the sub-pixel electrodes are not present, at least non-pixel gaps adjacent to the pixel gaps in the row direction;
evaporating a solvent included in the ink to form light emitting layers in the pixel gaps and dummy light emitting layers in the non-pixel gaps adjacent to the pixel gaps in the row direction; and
forming a counter electrode above the light emitting layers.

12. The method of claim 11, wherein
in pixel gaps corresponding to the sub-pixel electrodes included in any one of the sub-pixel electrode column groups, ink including organic light emitting material of a different color is applied to each of the pixel gaps, and
one or more inks selected from the inks including organic light emitting materials of different colors are applied in the non-pixel gaps adjacent to the pixel gaps in the row direction.

13. The method of claim 11, wherein
in the applying of ink to the pixel gaps, inks are applied in an order such that inks having a longer solvent evaporation time per unit area are applied earlier.

14. A method of manufacturing a light transmissive organic electroluminescence (EL) display panel, the method comprising:
preparing a substrate;
above the substrate, arranging columns of sub-pixel electrodes in each of which a plurality of sub-pixel electrodes are arranged along a column direction into sub-pixel electrode column groups of parallel sub-pixel electrode columns separated from each other by first gaps in the row direction, and arranging the sub-pixel electrode column groups parallel to each other and separated from each other by second gaps in the row direction wider than the first gaps in the row direction;
forming column banks that extend in the column direction, so as to sandwich each of the sub-pixel electrode columns in the row direction on portions of a top surface of the substrate where the sub-pixel electrode column groups are present, and at a pitch of the sub-pixel electrodes in the row direction on portions of the top surface of the substrate corresponding to the second gaps;
applying ink including organic light emitting material to, among gaps between the column banks, pixel gaps where the sub-pixel electrodes are present and applying dummy solvent to, among non-pixel gaps where the sub-pixel electrodes are not present, at least non-pixel gaps adjacent to the pixel gaps in the row direction;
evaporating a solvent included in the ink and the dummy solvent to form light emitting layers in the pixel gaps; and
forming a counter electrode above the light emitting layers.

* * * * *